(12) United States Patent
Ishimaru et al.

(10) Patent No.: US 8,063,433 B2
(45) Date of Patent: Nov. 22, 2011

(54) NONVOLATILE SEMICONDUCTOR MEMORY DEVICE

(75) Inventors: Tetsuya Ishimaru, Tokyo (JP); Yasuhiro Shimamoto, Tokorozawa (JP); Toshiyuki Mine, Fussa (JP); Yasunobu Aoki, Kodaira (JP); Koichi Toba, Hitachinaka (JP); Kan Yasui, Kodaira (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 637 days.

(21) Appl. No.: 12/109,340

(22) Filed: Apr. 24, 2008

(65) Prior Publication Data

US 2008/0265286 A1  Oct. 30, 2008

(30) Foreign Application Priority Data

Apr. 27, 2007 (JP) ................. 2007-119122

(51) Int. Cl.
*H01L 29/792* (2006.01)
(52) U.S. Cl. ................. 257/324; 257/E29.309
(58) Field of Classification Search .............. 257/324, 257/E29.309; 438/261
See application file for complete search history.

(56) References Cited

U.S. PATENT DOCUMENTS

| 5,467,309 A | 11/1995 | Tanaka et al. |
| 5,498,890 A * | 3/1996 | Kim et al. ............ 257/310 |
| 2003/0122204 A1 | 7/2003 | Nomoto et al. |
| 2004/0238878 A1 * | 12/2004 | Sato et al. ............ 257/315 |
| 2005/0230766 A1 | 10/2005 | Nomoto et al. |
| 2006/0065919 A1 | 3/2006 | Fujiwara |

FOREIGN PATENT DOCUMENTS

| CN | 1120231 A | 4/1996 |
| JP | 2002-203917 A | 7/2002 |
| JP | 2004-356562 A | 12/2004 |
| JP | 2006-128593 A | 5/2006 |
| KR | 10-2004-0103342 A | 8/2004 |

OTHER PUBLICATIONS

W. M. Arnoldbik et al., "Dynamic behavior of hydrogen in silicon nitride and oxynitride films made by low-pressure chemical vapor deposition" Physical Review B, vol. 48, No. 8, pp. 5444-5456, Aug. 15, 1993.

H. J. Stein et al., "Chemically Bound hydrogen in CVD $Si_3/SiH_4$ Ratio and on Annealing" Journal of the Electrochemical Society, vol. 124, No. 6, pp. 908-912, Jun. 1977.

* cited by examiner

*Primary Examiner* — Steven Fulk
(74) *Attorney, Agent, or Firm* — Miles & Stockbridge P.C.

(57) ABSTRACT

A memory cell includes an ONO film composed of a stacked film of a silicon nitride film SIN which is a charge trapping portion and oxide films BOTOX and TOPOX positioned under and over the silicon nitride film, a memory gate electrode MG over the ONO film, a source region MS, and a drain region MD, and program or erase is performed by hot carrier injection in the memory cell. In the memory cell, a total concentration of N—H bonds and Si—H bonds contained in the silicon nitride film SIN is made to be $5 \times 10^{20}$ $cm^{-3}$ or less.

14 Claims, 13 Drawing Sheets

NONVOLATILE SEMICONDUCTOR MEMORY DEVICE

CROSS-REFERENCE TO RELATED APPLICATION

The present application claims priority from Japanese Patent Application No. JP 2007-119122 filed on Apr. 27, 2007, the content of which is hereby incorporated by reference into this application.

TECHNICAL FIELD OF THE INVENTION

The present invention relates to nonvolatile semiconductor memory devices and, particularly, relates to nonvolatile semiconductor memory devices suitable for improving data retention characteristics.

BACKGROUND OF THE INVENTION

EEPROMs (Electrically Erasable and Programmable Read Only Memories) have been widely used as electrically programmable/erasable nonvolatile semiconductor memory devices. These memory devices (memories) typified by flash memories, which are widely used today, have an electrically conductive floating gate electrode or trapping dielectric film surrounded by oxide films under a gate electrode of a MOS (Metal Oxide Semiconductor) transistor. A charge trapping state in the floating gate or in a trapping characteristic dielectric film is used as memory information, and it is read as a threshold value of the transistor.

The trapping dielectric film is a dielectric film capable of trapping charges, and a silicon nitride film is referred to as an example thereof. The threshold value of the MOS transistor is shifted by injection/discharge of charges into or from such a charge trapping region to operate it as a memory element. A nonvolatile memory that uses such a silicon nitride film as the charge trapping region is called a MONOS (Metal Oxide Nitride Oxide Semiconductor) type memory, and is excellent in the reliability of data retention as compared with the electrically conductive floating gate film since charges are discretely trapped. Moreover, since it is excellent in the reliability of data retention, it has advantages in which, for example, oxide films over and under the silicon nitride film can be made to be thinner, so that low voltage program/erase operations can be performed.

The silicon nitride film used in the charge trapping region of the above-described MONOS type memory always contains hydrogen. It is known that a contained hydrogen concentration is approximately $3 \times 10^{21}$ cm$^{-3}$ in the case where the film is formed by generally-used Low Pressure Chemical Vapor Deposition (LPCVD). (for example, see Physical Review B, Vol. 48, pp 5444, 1993, Non-Patent Document 1). The hydrogen is present in the form of a bond between silicon and hydrogen (Si—H bond) or bond between nitrogen and hydrogen (N—H bond). Generally, the number of N—H bonds is larger than that of Si—H bonds (for example, see Journal of the Electrochemical Society, Vol. 124, pp. 909, 1977, Non-Patent Document 2).

Concerning the hydrogen of the silicon nitride film used in the charge trapping region of the MONOS type memory, several proposals for improving the data retention characteristics by reducing the density of Si—H bonds have been made. In Japanese Patent Application Laid-open Publication No. 2006-128593 (Patent Document 1), the silicon nitride film is formed by Chemical Vapor Deposition (CVD) under a condition in which a flow ratio of dichlorosilane (DCS: SiCl$_2$H$_2$)/ammonia (NH$_3$) is 0.1 or less, so that the density of Si—H bonds is set at $1 \times 10^{21}$ cm$^{-3}$ or less. As a result, the trap density in the silicon nitride film is reduced, the charges in the silicon nitride film are not readily moved, and therefore, the data retention characteristics can be improved.

In Japanese Patent Application Laid-open Publication No. 2004-356562 (Patent Document 2), the density of the Si—H bonds in the silicon nitride film is made to be $1 \times 10^{20}$ cm$^{-3}$ or less by employing Atomic Layer Deposition (ALD). As a result, shallow traps in the silicon nitride film are reduced, the charges in the silicon nitride film are not readily moved, and the data retention characteristics can be improved.

The reason why the Si—H bond is attracted instead of the N—H bond higher in density than the Si—H bond being present in the silicon nitride film is that bonding energy of the Si—H bond is smaller, and therefore the bond is readily broken by energy such as a thermal load during manufacturing processes.

As a method of forming the silicon nitride film with a low hydrogen concentration including the N—H bond, there is a method in which the film is formed by using a gas containing no hydrogen. In Japanese Patent Application Laid-open Publication No. 2002-203917 (Patent Document 3), a method in which the silicon nitride film is formed by using silicon tetrachloride SiCl$_4$ and ionized nitrogen in a plasma state is disclosed.

SUMMARY OF THE INVENTION

The problem to be solved by the present invention is deterioration of data retention characteristics caused by the conventionally unknown mechanisms which are found out by the present inventors in a semiconductor device having a nonvolatile semiconductor memory which uses a silicon nitride film as a charge trapping region and performs program or erase by injecting hot carriers (hot electrons or hot holes).

The mechanisms which deteriorate the above-described data retention characteristics comprise three mechanisms, "discharge of hydrogen", "diffusion of hydrogen", and "deterioration reaction caused by hydrogen". Hereinafter, each of the mechanisms will be described.

Note that, herein, injecting electrons into the silicon nitride film to increase the threshold voltage of the MONOS type memory is defined as "program", a state where the threshold voltage is increased is defined as a "programmed state". Also, injecting holes into the silicon nitride film or discharging the electrons trapped in the silicon nitride film to reduce the threshold voltage of the MONOS type memory is defined as "erase", and a state where the threshold voltage is reduced is defined as an "erased state". Not that, explanations will be given based on an n-channel MONOS type memory. The same is also applied to a p-channel MONOS type memory in principle.

The first one, "discharge of hydrogen", is caused by injecting hot electrons into the silicon nitride film of the charge trapping region at the time of program or by injecting hot holes thereinto at the time of erase. The N—H bond and Si—H bond present in the silicon nitride film are broken by the energy of the hot carriers, so that unbound hydrogen is generated. When a temperature is increased to a high temperature of approximately 100° C. to 150° C. in this state, the unbound hydrogen is released from the silicon nitride film to a silicon oxide film and a silicon substrate. The energy of the hot carriers is higher than the thermal energy in manufacturing processes, so that not only the Si—H bond but also the N—H bond higher in bonding energy than the Si—H bond is also broken.

Therefore, reducing the N—H bonds higher in density than the Si—H bond is effective for reducing the amount of released hydrogen. Also, there is a characteristic that, as the temperature of hot carrier injection is higher, the data retention characteristics are more deteriorated. This is because when the hot carrier injection is performed at a high temperature at which hydrogen is readily released, the probability in which hydrogen in the unbound state is released before being rebound is increased, so that the amount of released hydrogen is increased.

The subsequent "diffusion of hydrogen" occurs during a period in which a high temperature is retained. The hydrogen released from the silicon nitride film of the charge trapping region is diffused into the silicon oxide film and the silicon substrate, and is spread from the memory cell in which the hydrogen is released to a surrounding area. Even in memory cells to which the hot carriers have not been injected, when the hydrogen released from neighboring memory cells into which the hot carriers have been injected is diffused, the data retention characteristics are deteriorated. Moreover, as a temperature at the time of retention is higher, the diffusion is faster, and therefore, the data retention characteristics are more deteriorated.

In the "deterioration reaction caused by hydrogen", it is conceived that a deterioration reaction similar to NBTI (Negative Bias Temperature Instability), which is well known as a deterioration phenomenon of a p-type transistor, occurs. When the diffused hydrogen reaches a memory cell which has a high threshold voltage in the programmed state, the diffused hydrogen and the holes trapped in the silicon substrate cause a NBTI reaction, so that interface states are generated at an interface between the silicon substrate/silicon oxide film, and positive fixed charges are generated in the silicon oxide film. The interface states and the positive fixed charges decrease the threshold voltage of the programmed state and cause deterioration of the data retention. Trapping of the holes in the silicon substrate is a condition causing deterioration of the data retention characteristics. However, since the holes are not trapped in a surface of the silicon substrate in the memory cell having a low threshold voltage in the erased state, the deterioration reaction caused by hydrogen does not occur. In addition, in the case of the p-channel MONOS type memory, the deterioration reaction caused by hydrogen occurs in the memory cell having a high threshold voltage and in which the channel thereof is in an inversion state.

As it can be understood from the above described mechanisms, features of this deterioration are, for example: (a) as the substrate temperature during the hot carrier injection is higher, the data retention characteristics are more deteriorated; (b) as the temperature of data retention is higher, the data retention characteristics are more deteriorated; (c) reduction of the threshold voltage does not occur in the erased state; and (d) when the hot carrier injection is performed in the neighboring memory cell, the data retention characteristics are deteriorated also in the memory cells in which the hot carrier injection is not performed.

The data retention characteristics showing these features (a) to (d) are respectively shown in FIG. 19 to FIG. 22. FIG. 19 shows the data retention characteristics of the memory cell, which are obtained by performing program when the substrate temperature is retained at 150° C. after program/erase cycles have been respectively performed at substrate temperatures of 125° C. and 150° C. As the substrate temperature at the time of injection of the hot carriers in program/erase cycles is higher, the reduced amount of the threshold voltage is larger, so that the data retention characteristics are more deteriorated. This shows the feature of above-described (a).

FIG. 20 shows the data retention characteristics of the memory cell, which is obtained by performing program respectively when the substrate temperatures are retained at 125° C. and 150° C. after program/erase cycles have been performed at a substrate temperature of 150° C. This shows the feature of (b) that as a temperature of data retention is higher, the decreased amount of the threshold voltage is larger, so that the data retention characteristics are more deteriorated.

FIG. 21 shows the data retention characteristics of the memory cell in the erased state in the case where a substrate temperature is retained at 150° C. after program/erase cycles are performed at a substrate temperature of 150° C. That shows the feature of (c) that the threshold voltage is not decreased in the erased state.

FIG. 22 shows the data retention characteristics of the memory cell after program is performed at 150° C. in two cases where a next cell undergoes program/erase cycles at a substrate temperature of 150° C. and the next cell does not undergoes it. Here, the memory cell whose data retention characteristics are measured have not undergone program/erase cycles. That shows the feature of (d) that when the hot carrier injection is performed to the next memory cell, deterioration of the data retention characteristics appears in the memory cell in which the hot carrier injection is not performed.

An object of the present invention is to suppress deterioration of the data retention characteristics of a nonvolatile semiconductor memory device to improve reliability thereof. More specifically, the object is to suppress deterioration of the data retention characteristics due to the NBTI reaction caused by the hydrogen released from the silicon nitride film by injection of hot carriers and the holes trapped in the silicon substrate.

The above and other objects and novel characteristics of the present invention will be apparent from the description of this specification and the accompanying drawings.

The invention disclosed in the present application is to suppress the three mechanisms, "discharge of hydrogen", "diffusion of hydrogen", and "deterioration reaction caused by hydrogen" each of which causes deterioration of the data retention characteristics which is considered a problem. The typical ones of the invention will be simply described below.

A nonvolatile semiconductor memory device related to the present invention comprises: a pair of a source and drain regions formed in a semiconductor substrate; a first gate electrode formed over a region of the semiconductor substrate between the source and drain regions; and a charge trapping portion formed between a surface of the semiconductor substrate and the first gate electrode, wherein the charge trapping portion includes a first nitride film in which a total concentration of bonds between nitrogen and hydrogen (N—H bond) and bonds between silicon and hydrogen (Si—H bond) of $5 \times 10^{21}$ cm$^{-3}$ or less, and program or erase is performed by the hot carrier injection into the charge trapping portion.

Another nonvolatile semiconductor memory device according to the present invention comprises: a first transistor formed in a memory region, having a gate dielectric film including a nitride film, and performing program or erase by the hot carrier injection; a second transistor formed in a logic region; a first contact electrically connected to a first source or a first drain of the first transistor; and a second contact electrically connected to a second source or a second drain of the second transistor, wherein the first gate electrode, the first source, and the first drain of the first transistor are not covered with a silicon nitride film for forming a self-align contact or a portion thereof is covered with the silicon nitride film; and a silicon nitride film for forming a self-align contact is formed on the second source or the second drain to which the second contact of the second transistor is connected.

Also, another nonvolatile semiconductor memory device according to the present invention comprises: a pair of a source and drain regions formed in a semiconductor substrate; a first gate electrode formed over a region of the semiconductor substrate between the source and drain regions; a charge trapping portion formed between a surface of the semiconductor substrate and the first gate electrode; and an oxide film formed between the surface of the semiconductor substrate and the charge trapping portion, wherein a bond between a halogen element and a silicon element is present in an interface of the oxide film and the semiconductor substrate or in the oxide film, and program or erase is performed by the hot carrier injection into the charge trapping portion.

The effects obtained by typical aspects of the present invention will be briefly described below.

The high reliability of the nonvolatile semiconductor memory device can be realized. Particularly, deterioration of the data retention characteristics after program/erase cycles can be suppressed.

BRIEF DESCRIPTIONS OF THE DRAWINGS

DESCRIPTIONS OF THE PREFERRED EMBODIMENTS

Figure 1:
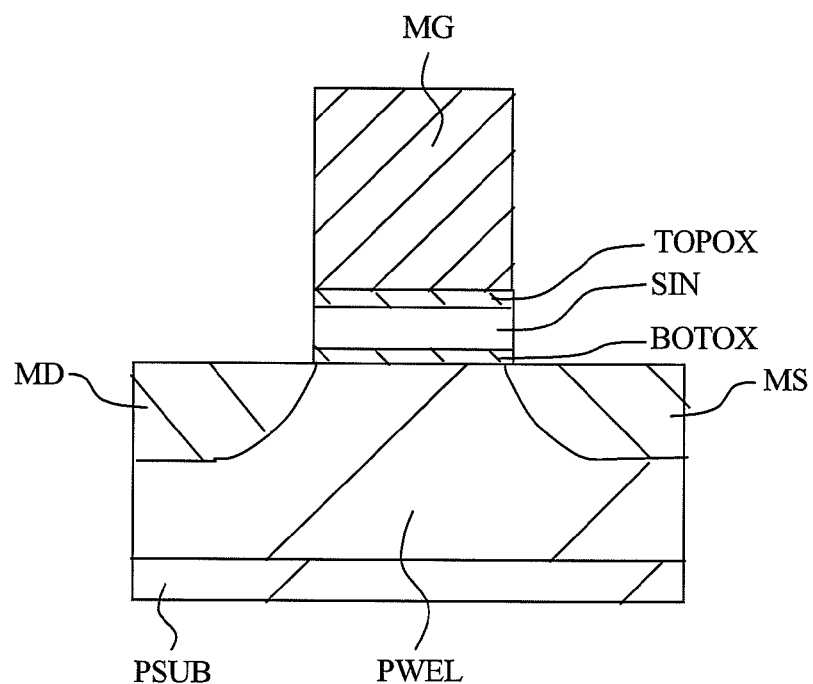
FIG. 1 is a cross-sectional view of a principal part of a nonvolatile semiconductor memory device (flash memory) according to an embodiment of the present invention.

Hereinafter, embodiments of the present invention will be described in detail based on drawings. Note that, the same members are denoted by the same reference numerals throughout all the drawings for describing the embodiments in principal, and repetitive descriptions thereof will be omitted. Also, in some drawings used in the embodiments, hatching is used even in a plan view to make the drawings easy to see.

In the embodiments below, descriptions will be given based on an n-type channel memory cell. Also, in the case of a p-type channel memory cell, it can be handled like the n-type channel memory cell. In other words, also in the p-type channel memory cell, hydrogen is released by the hot carrier injection into a silicon nitride film of a charge trapping portion, and the released hydrogen and holes in a silicon substrate cause the NBTI reaction, so that the data retention characteristics are deteriorated.

First Embodiment

In a first embodiment, among the three mechanisms causing deterioration of the data retention characteristics, "discharge of hydrogen" is reduced, thereby suppressing deterioration of the data retention characteristics. Specifically, the N—H bonds and Si—H bonds present in a silicon nitride film being a charge trapping portion are reduced, thereby reducing the amount of released hydrogen due to the hot carrier injection. Hereinafter, a hydrogen concentration represents the total concentration of the N—H bonds and Si—H bonds. The hydrogen concentration can be measured by SIMS (Secondary Ion Mass Spectroscopy) or thermal desorption analysis TDS (Thermal Desorption Spectroscopy).

FIG. 1 is a cross-sectional view of a principal part of a typical nonvolatile semiconductor memory device (flash memory) of the present embodiment.

As shown in FIG. 1, a memory cell comprises: an ONO film (ONO) composed of a stacked film of a silicon nitride film (nitride film) SIN being a charge trapping portion, and oxide films (silicon oxide films) BOTOX and TOPOX positioned over and under SIN; a memory gate electrode MG composed of electric conductor such as n-type polysilicon; a source region (source diffusion layer, n-type semiconductor region) MS composed of an n-type impurity (semiconductor region in which the n-type impurity is introduced (silicon region)); and a drain region (drain diffusion layer, n-type semiconductor region) MD composed of an n-type impurity (semiconductor region in which the n-type impurity is introduced (silicon region)).

The source region MS and the drain region MD are formed in a p-type well region PWEL provided on a p-type silicon substrate (semiconductor substrate) PSUB. A film in which the hydrogen concentration is reduced is used as the silicon nitride film SIN. As the silicon nitride film SIN, a silicon oxynitride film in which the hydrogen concentration is reduced may be used.

Figure 2:
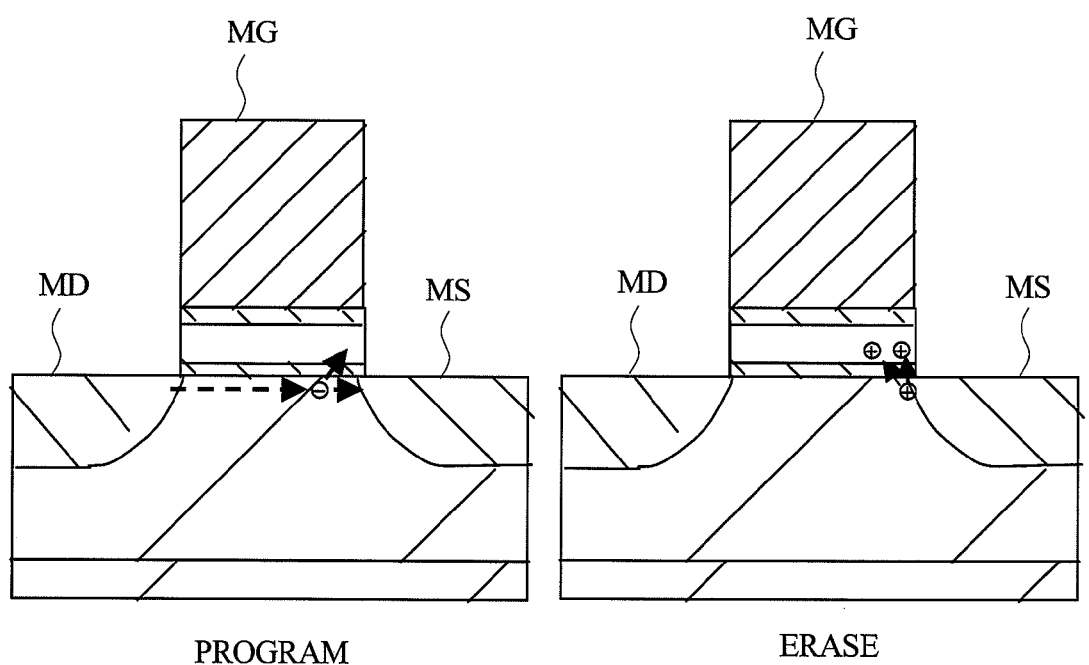
FIG. 2 is a cross-sectional view of principal parts of a substrate showing program/erase methods of the nonvolatile semiconductor memory device according to the embodiment of the present invention.

FIG. 2 shows a program operation and an erase operation of the memory cell shown in FIG. 1. The program operation is performed by channel hot electron injection. As program voltages, for example, a voltage applied to the source region MS is 5 V, a voltage applied to the memory gate electrode MG is 7 V, a voltage applied to the drain region MD is 0 V, and a voltage applied to the well is 0 V. In the erase operation, holes generated in band-to-band tunneling phenomenon (BTBT: Band-To-Band Tunneling) are accelerated and injected. As erase voltages, for example, a voltage applied to the memory gate electrode MG is −5 V, a voltage applied to the source region MS is 6 V, a voltage applied to the drain region MD is 0 V, and a voltage applied to the well is 0 V. In a read operation, for example, a voltage applied to the drain region MD is 1.5 V, a voltage applied to the source region MS is 0 V, a voltage applied to the memory gate electrode MG is 1.5 V. The read operation is performed in a manner in which the voltage between the source and drain is in the reverse direction of the program operation.

When the program operation, erase operation, and read operation are performed by using reverse voltages applied to the source and drain, trapping locations for charges can be made to be at two locations in the source side and drain side, so that a 2-bit/cell operation can be performed.

Instead of the above described erase method, an erase method, which by applying a negative voltage to the memory gate, electrons are pulled to the silicon substrate with FN tunneling or holes are injected from the substrate with FN tunneling, may be employed. Also, an erase method, which by applying a positive voltage to the memory gate, electrons are pulled to the memory gate with FN tunneling, or holes are injected from the memory gate with FN tunneling, may be employed.

Subsequently, the effects of reducing the amount of hydrogen contained in the silicon nitride film of the charge trapping portion will be described. As described above, presence of both the hydrogen released from the silicon nitride film and the holes trapped in the silicon substrate causes the NBTI reaction, and deteriorates the data retention characteristics. A rate of the NBTI reaction is limited by the amount of hydrogen when the amount of holes is sufficiently larger than the amount of hydrogen; and conversely, when the amount of the hydrogen is sufficiently larger than the amount of holes, it is limited by the amount of holes.

Figure 3:
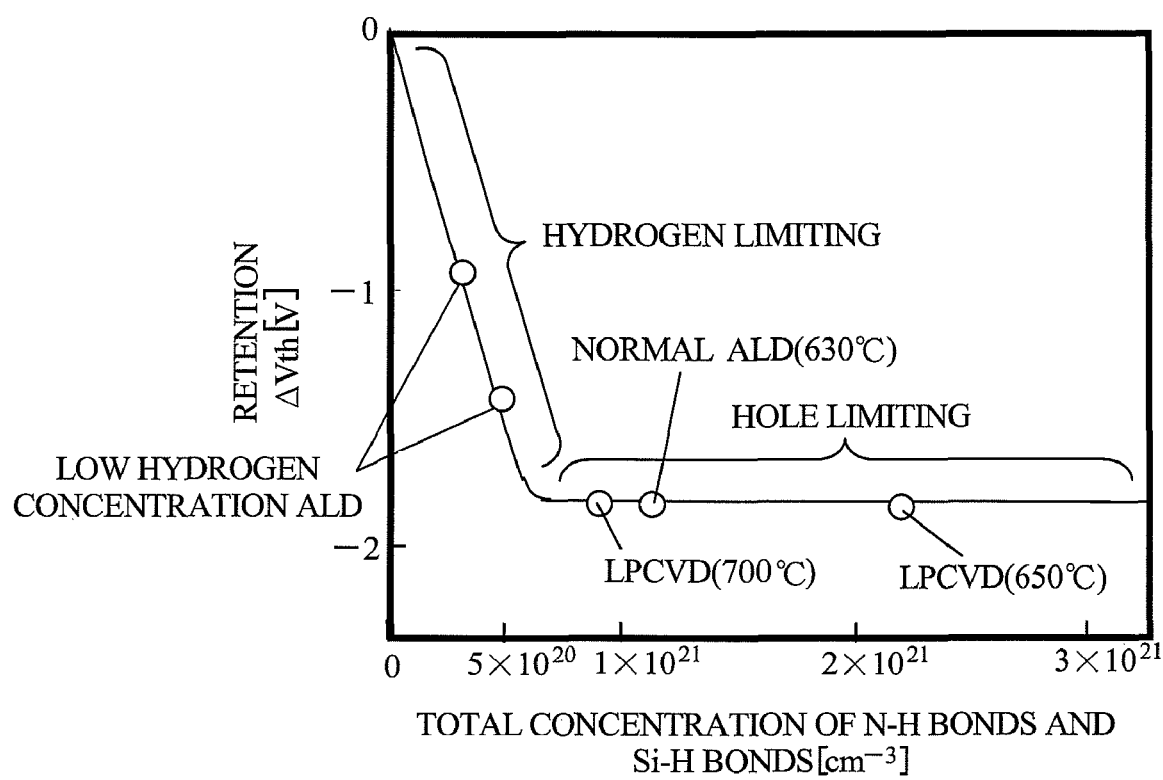
FIG. 3 is a graph showing a relation between a total concentration of N—H bonds and Si—H bonds and threshold decrease amount of retention.

FIG. 3 shows a relation between the total concentration of N—H bonds and Si—H bonds in the silicon nitride film and the reduction amount of a threshold voltage in data retention for 1000 hours at 150° C. after program/erase cycles have been performed 100 thousand times at a high temperature of 150° C. The total concentration of the N—H bonds and Si—H bonds in the silicon nitride film is $2.2 \times 10^{21}$ cm$^{-3}$ when the film is formed by the LPCVD method at 650° C., or is $9 \times 10^{20}$ cm$^{-3}$ by the LPCVD method at an increased temperature of 700° C. In the general ALD method in which the film is formed by alternately introducing a SiH$_2$Cl$_2$ gas and a NH$_3$ plasma gas, since the hydrogen concentration can be reduced to ½ to ⅓ compared to the film formation of the LPCVD method at the same temperature, the hydrogen concentration is $1.1 \times 10^{21}$ cm$^{-3}$ at 630° C. When the data retention characteristics are measured in the memory cells using these silicon nitride films, the characteristics have no difference. This is because the concentrations are in a region where the rate of the NBTI reaction is limited by the amount of holes, that is, the characteristics are not determined by the amount of hydrogen but by the amount of holes.

On the other hand, in a silicon nitride film formed by the ALD method in which the film is exposed alternately to a gas containing silicon but not containing hydrogen, and a nitride plasma gas, which will be described later in detail, the total concentration of the N—H bonds and the Si—H bonds can be reduced to the first half of the order of $10^{20}$ cm$^{-3}$. As a result, the data retention characteristics are improved. When the total concentration of the N—H bonds and the Si—H bonds is shifted around the first half of the order of $10^{20}$ cm$^{-3}$ by simultaneously introducing a slight amount of NH$_3$ plasma gas containing hydrogen, the data characteristics are varied depending on the total concentration of the N—H bonds and the Si—H bonds. This means that the rate of the NBTI reaction is shifted to a region where the rate is limited by the amount of hydrogen, and the characteristics are determined not by the amount of holes but by the amount of hydrogen. As described above, it can be understood that an effect of improving the data retention characteristic can be obtained when the total concentration of the N—H bonds and the Si—H bonds in the silicon nitride film is made to be $5 \times 10^{20}$ cm$^{-3}$ or less.

Hereinafter, the total concentration of the N—H bonds and the Si—H bonds in the silicon nitride film by which the effect of improving the data retention characteristics is obtained will be derived by another method. As described above in the "problem to be solved by the invention", when hot electrons are injected into the silicon nitride film, hydrogen is released from the silicon nitride film. The hydrogen concentration in the silicon nitride film is reduced by the release of hydrogen with this hot electron injection, and it is confirmed how much the hydrogen concentration has to be reduced to improve the retention characteristics deterioration.

In a confirmation test, a memory cell using the silicon nitride film formed at 700° C. by the LPCVD method shown in FIG. 3 is used. The test procedure is as described below. First of all, first hot electron injection into the nitride film is performed at a high temperature of 150° C. for t seconds to release the hydrogen in the nitride film, thereby reducing a residual hydrogen concentration of the nitride film. Next, in order to prevent the hydrogen released by the hot electron injection from affecting a retention test to be performed later, sufficient annealing (at 300° C. for 1 hour) for reducing the concentration of the hydrogen which is released to vicinities of the memory cell to which the hot electrons have been injected is performed. Subsequently, second hot electron injection is performed at 150° C. to release the hydrogen in the nitride film, and evaluation of the retention characteristics is performed in a next memory cell to which the hot electron injection has not been performed. The test are conducted plural times with the first hot electron injection time t being changed in order to derive the residual hydrogen concentration (function of the first hot electron injection time t) of the nitride film at which an effect of suppressing the retention deterioration appears.

Figure 23:
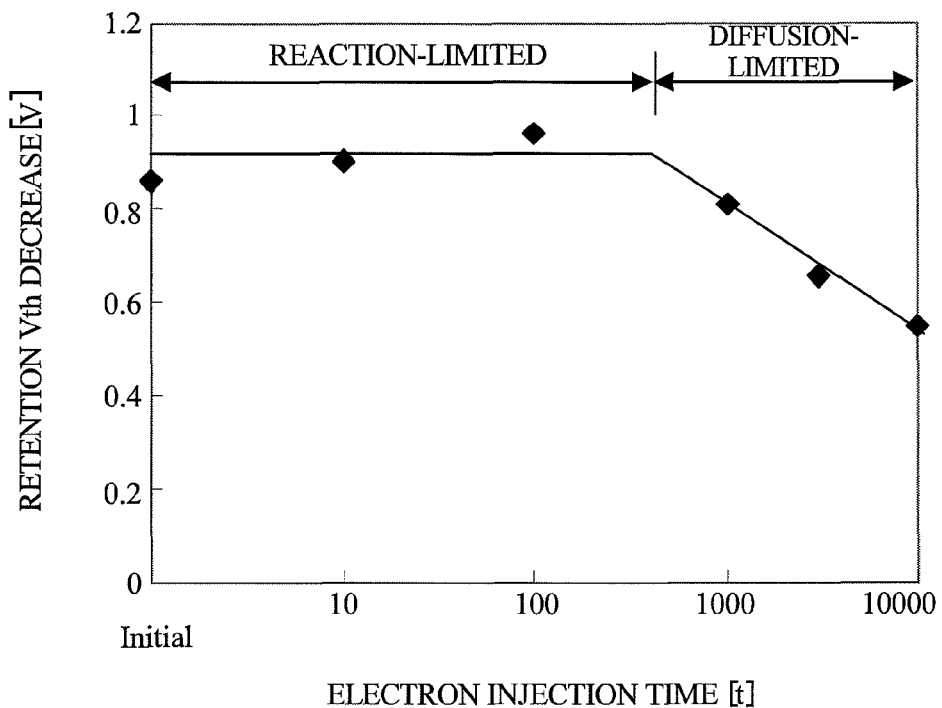
FIG. 23 is a graph showing a relation between electron injection time and retention threshold voltage decrease amount.

FIG. 23 shows the test result of evaluation of the relation between the first hot electron injection time t and the retention threshold voltage decrease amount. When the hot electron injection time t is increased, the threshold voltage decrease amount substantially does not change until the time of 100 s, and becomes small at 1000 s or more where the effect of suppressing the retention deterioration appears. The reason that the threshold voltage decrease amount does not change until 100 s is that the region until 100 s is in the reaction-limited region where the retention deterioration is determined not by the amount of hydrogen but by the amount of holes. It can be understood that the reason the threshold voltage decrease amount becomes small at 1000 s or more is that the region is in the diffusion-limited region where the retention deterioration is determined not by the amount of holes but by the amount of hydrogen.

From the results of FIG. 23, the hydrogen concentration in the nitride film in the case of the hot electron injection for 1000 s wherein the effect of suppressing the retention deterioration appears will be estimated.

The change rate $dR(t)/dt$ of the residual hydrogen concentration $R(t)$ in the nitride film is equivalent to the value of the hydrogen release rate $E(t)$ caused by the hot electron injection when a negative symbol is added to the value. The hydrogen release rate is proportional to the probability that residual hydrogen meets hot electrons, in other words, the product of the residual hydrogen concentration $R(t)$ and a hot electron injection amount $J$ (C/cm²/s). Therefore, when a proportional constant is A, $dR(t)/dt$ can be expressed by $$dR(t)/dt = -E(t) = -A \times J \times R(t) \quad \text{equation (1)}.$$

When $R(t)$ is expressed by a function of t, it is expressed by $$R(t) = R_0 \times \exp(-\alpha t) \quad \text{equation (2)},$$

wherein $R_0$ and $\alpha$ are constants.

$R(t)$ of the case of t=1000 seconds corresponds to the hydrogen concentration at which the effect of suppressing the retention deterioration appears in FIG. 23. When $R_0$ and $\alpha$ are known, the value thereof can be derived.

The first one, $R_0$ is the hydrogen concentration in the nitride film at t=0 second, in other words, $R_0$ is the hydrogen concentration originally contained in the nitride film. The nitride film used in the present test is the silicon nitride film formed at 700° C. by the LPCVD method. The hydrogen concentration $R_0$ of the film is $9 \times 10^{20}$ cm⁻³ as shown in FIG. 3.

The other one, $\alpha$ can be obtained from the test result of the retention deterioration shown in FIG. 23. A retention threshold voltage decrease amount $\Delta Vth\_r(t)$ shown in FIG. 23 includes components such as discharge of charges to the silicon substrate as well as hydrogen deterioration, and can be expressed as a sum of a decrease component $\Delta Vth\_H(t)$ caused by the hydrogen deterioration and a decrease component $\Delta Vth\_e$ other than the hydrogen deterioration. The former deterioration component $\Delta Vth\_H(t)$ caused by the hydrogen deterioration is proportional to the hydrogen release amount caused by the second hot electron injection. It can be said that the hydrogen release amount caused by the second hot electron injection is proportional to the residual hydrogen concentration $R(t)$.

Therefore, $\Delta Vth\_H(t)$ and $R(t)$ have a proportional relation. The latter decrease component $\Delta Vth\_e$ other than the hydrogen decrease is constant regardless of t. Therefore, the retention threshold voltage decrease amount $\Delta Vth\_r(t)$ is:

$$\Delta Vth\_r(t) = \Delta Vth\_H(t) + \Delta Vth\_e \quad \text{equation (3)}$$
$$= B \times R(t) + \Delta Vth\_e$$
$$= C \times \exp(-\alpha t) + \Delta Vth\_e.$$

Figure 24:
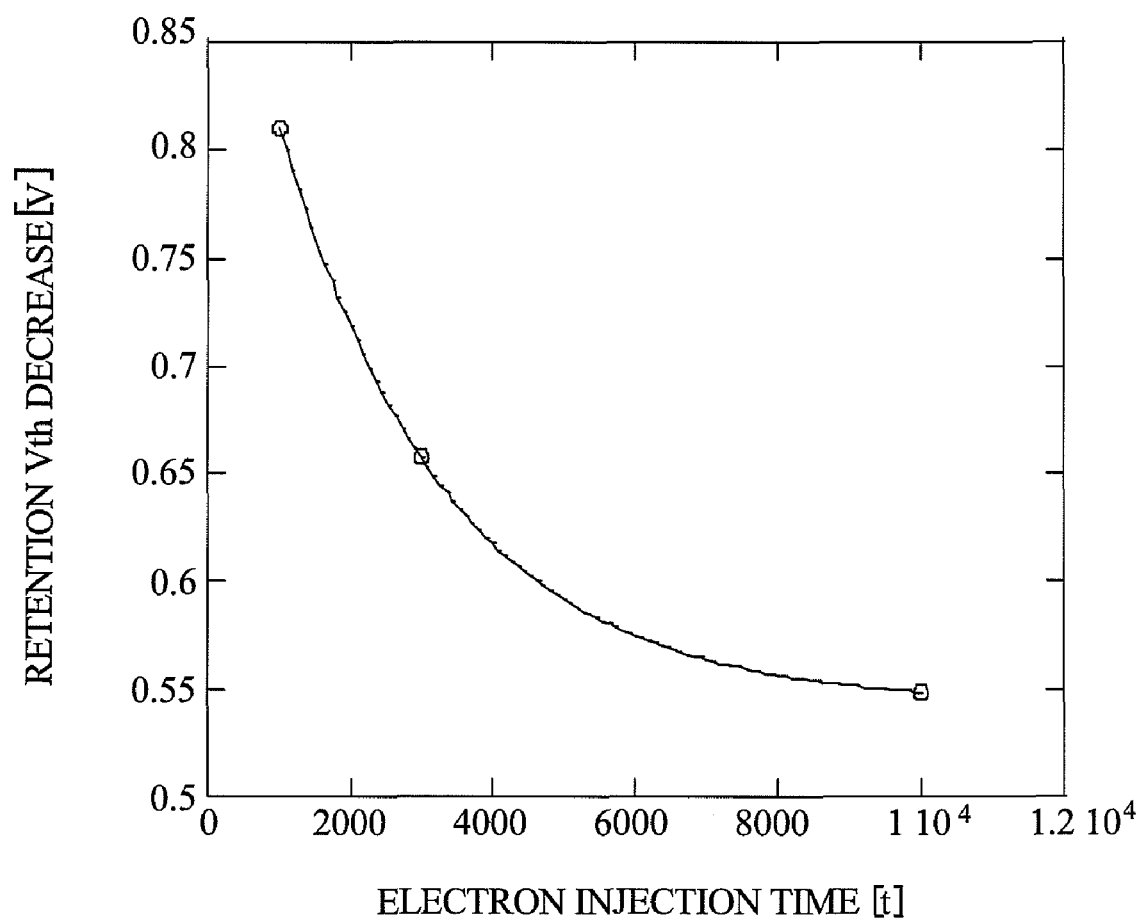
FIG. 24 is a graph showing a result of fitting data of the diffusion-limited region in the data of FIG. 23.

FIG. 24 shows the result of fitting of three points after 1000 at which the retention deterioration is determined by diffusion limited in the measurement data of FIG. 23. When the constants C, $\alpha$, and $\Delta Vth\_e$ of the equation (3) are obtained from the result, C=0.4, $\alpha$=0.0004, and $\Delta Vth\_e$=0.5.

When the $R_0$ and $\alpha$ are substituted for in the equation (2) to obtain $R(t)$ of the case of t=1000 seconds, $R(1000 \text{ s}) = R_0 \exp(-\alpha \times 1000) = 9 \times 10^{20} \times \exp(-0.0004 \times 1000) = 6 \times 10^{20}$ is obtained. According to the above description, the hydrogen concentration in the nitride film, which the effect of suppressing retention deterioration caused by decrease of the hydrogen appears, can be estimated to be approximately $6 \times 10^{20}$/cm², and it was confirmed by the different method that the effect can be obtained when the hydrogen concentration in the nitride film, which the effect of suppressing retention deterioration shown in FIG. 3 appears, is at least $5 \times 10^{20}$/cm² or less.

Subsequently, an example of a manufacturing method of the nonvolatile semiconductor memory device (memory cell) shown in FIG. 1 will be described with reference to FIG. 4 to FIG. 7. FIG. 4 to FIG. 7 are cross-sectional views of principal parts of a substrate showing the manufacturing method of the nonvolatile semiconductor memory device of the present embodiment. Memory cells are arranged in an array shape in a memory region; however, a cross sectional part of merely one memory cell is shown in each of the drawings.

Figure 4:
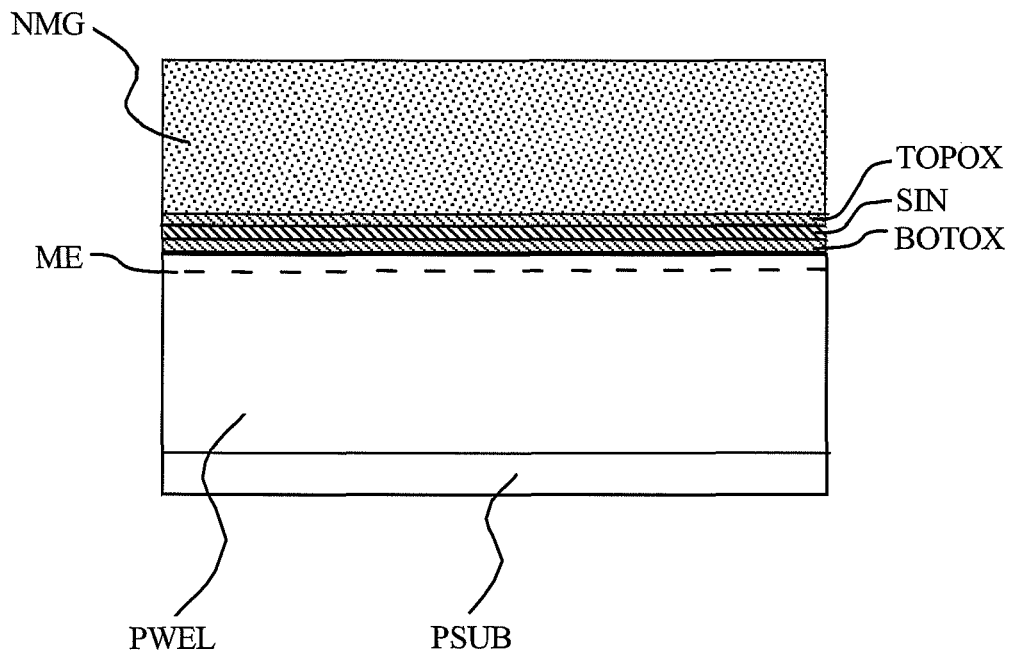
FIG. 4 is a cross-sectional view of a principal part of a substrate showing a manufacturing method of the nonvolatile semiconductor memory device according to the embodiment of the present invention.

First of all, FIG. 4 will be described. On a p-type silicon substrate PSUB, as necessary, a cell isolation oxide film region STI is formed, and a p-type well region PWEL which serves as a memory cell region is formed. On a surface part of the p-type well region PWEL, a p-type or n-type impurity region (channel region) ME for adjusting a threshold voltage value is formed.

Next, after the silicon substrate surface is subjected to cleaning treatment, an ONO (Oxide Nitride Oxide) film including a silicon nitride film in which a hydrogen concentration (total concentration of N—H bonds and Si—H bonds)

is $5\times10^{20}$ cm$^{-3}$ or less is stacked. When the ONO film is formed, for example, after a bottom oxide film BOTOX is formed by thermal oxidation or ISSG (In-Situ Steam Generation) oxidation, a silicon nitride film SIN having a hydrogen concentration of $5\times10^{20}$ cm$^{-3}$ or less is formed, and furthermore, a top oxide film TOPOX is formed by vapor phase growth and thermal oxidation or ISSG oxidation.

When both program and erase are to be performed by the hot carrier injection, film thicknesses of the bottom oxide film BOTOX and the top oxide film TOPOX are desired to be 3 nm or more which does not readily cause a tunneling phenomenon. When erase is to be performed by pulling electrons to the silicon substrate by FN tunneling or by injecting holes from the substrate by FN tunneling, the film thickness of the bottom oxide film BOTOX has to be as thin as approximately 1.5 nm to 3 nm. Also, when erase is to be performed by pulling electrons to the gate by FN tunneling or by injecting holes from the gate by FN tunneling, the top oxide film TOPOX is not formed, or the film thickness of the top oxide film TOPOX has to be as thin as 2 nm or less. The film thickness of the silicon nitride film SIN made to be 2 nm or more so that electric charges capable of sufficiently shifting the threshold voltage can be trapped. The forming method of the silicon nitride film having a low hydrogen concentration will be described later in detail.

Subsequently, on the ONO film, an n-type polysilicon layer NMG (approximately 150 nm) which serves as a memory gate electrode MG is deposited.

Figure 5:
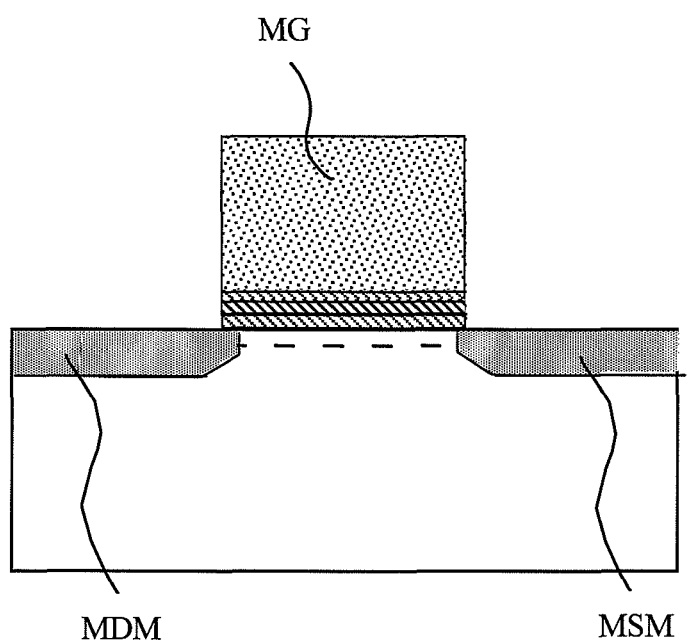
FIG. 5 is a cross-sectional view of a principal part of the substrate showing the manufacturing method of the nonvolatile semiconductor memory device according to the embodiment of the present invention.

Next, FIG. 5 will be described. By using photolithography techniques and dry etching techniques, the n-type polysilicon layer NMG shown in FIG. 4 is processed, thereby forming the memory gate electrode MG. The memory gate electrode extends in the depth direction of the drawing and is in a linear pattern. Subsequently, the exposed top oxide film TOPOX and the silicon nitride film SIN are respectively removed by hydrofluoric acid and hot phosphoric acid. Then, ion implantation of a low-concentration n-type impurity is performed, thereby forming a low-concentration n-type impurity region MDM in a drain part and a low-concentration n-type impurity region MSM in a source part.

Figure 6:
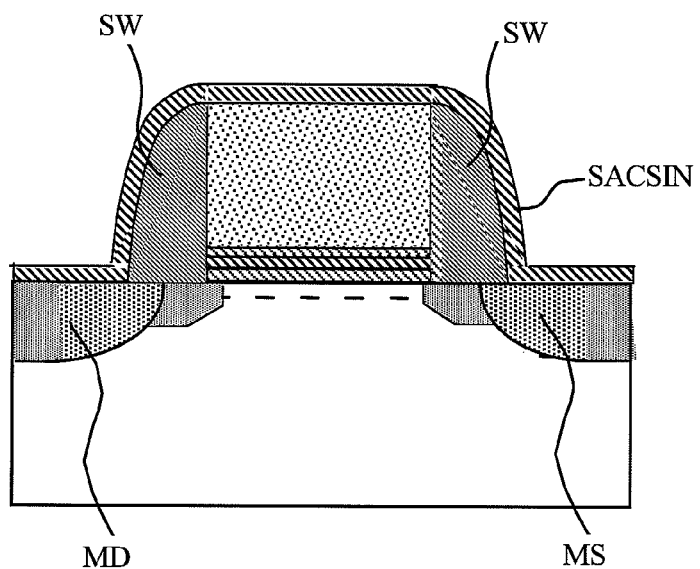
FIG. 6 is a cross-sectional view of a principal part of the substrate showing the manufacturing method of the nonvolatile semiconductor memory device according to the embodiment of the present invention.

Next, FIG. 6 will be described. After the part of the bottom oxide film BOTOX of the ONO film that is exposed from the surface is removed by hydrofluoric acid, an oxide film is deposited, and then is subjected to etching by using anisotropic etching techniques, thereby forming a side wall spacer SW on the side wall of the memory gate electrode MG. Ion implantation of an n-type impurity is performed, thereby forming a drain region MD and a source region MS. Subsequently, a silicon nitride film SACSIN for self align contact (SAC: Self Align Contact) is deposited.

Next, FIG. 7 will be described. An interlayer dielectric film INS1 is deposited over an entire surface of the silicon substrate. By using photolithography techniques and dry etching techniques, a contact hole is formed over the drain region MD, and a metal layer (plug) CONT is formed in the opening (contact hole). Then, by using photolithography techniques and etching techniques, a first metal line M1 is formed, and then, an interlayer dielectric film INS2 is deposited. Then, although illustration of the later steps is omitted, a contact hole is formed in the interlayer dielectric film INS2, and an electric conductive film is further deposited and patterned to form a metal line. When the formation process of the interlayer dielectric film and the metal line is repeated in this manner, multi-layer metal lines can be formed.

Figure 7:
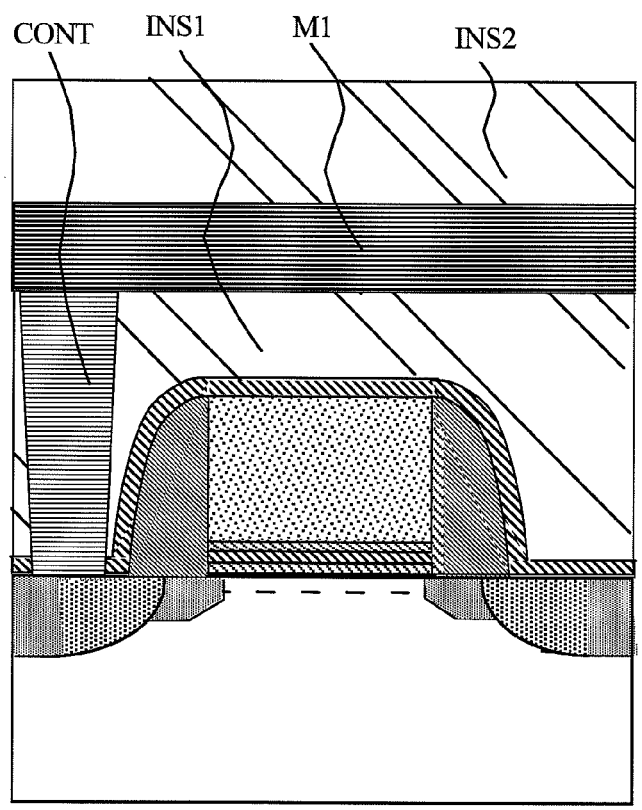
FIG. 7 is a cross-sectional view of a principal part of the substrate showing the manufacturing method of the nonvolatile semiconductor memory device according to the embodiment of the present invention.

Regarding the wiring direction of the memory cell manufactured by the above described method shown in FIG. 4 to FIG. 7, as shown in FIG. 7, the memory gate electrode MG and the source region MS extend in the direction perpendicular to the paper surface, while the first metal line M1 which is connected to the drain region MD and serves as a bit line extends in the direction orthogonal to the memory gate electrode MG and the source region MS.

The source region MS may use the first metal line to extend in the direction parallel to the drain region MD. Furthermore, like the memory cell shown in FIG. 8, the drain region MD and the source region MS may extend in the direction perpendicular to the paper surface as diffusion layer wiring, and the memory gate electrode MG may extend in the direction orthogonal to the diffusion layer wirings of the drain region MD and the source region MS.

Figure 8:
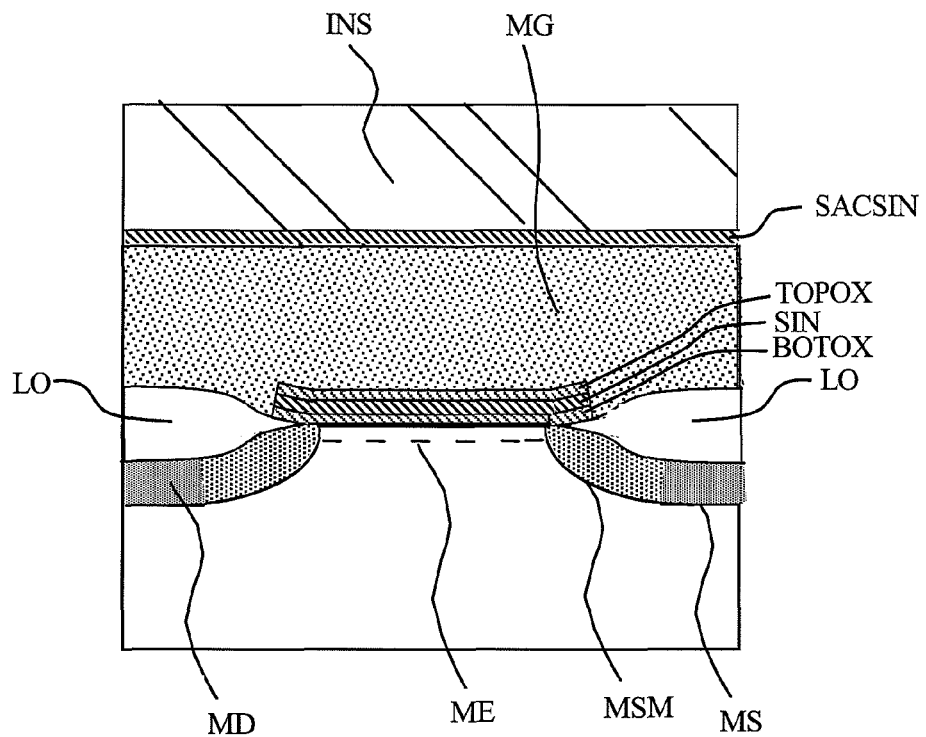
FIG. 8 is a cross-sectional view of a principal part of another nonvolatile semiconductor memory device (flash memory) according to the embodiment of the present invention.

A manufacturing method of the memory cell shown in FIG. 8 is different from that of the memory cell shown in FIG. 4 to FIG. 7. First of all, a bottom oxide film BOTOX of an ONO film, a silicon nitride film SIN of the ONO film, which has a hydrogen concentration of $5\times10^{20}$ cm$^{-3}$ or less, and a top oxide film TOPOX of the ONO film are formed. The ONO film in a region for formation of a source and a drain is removed by using photolithography techniques and dry etching techniques. Next, an oxide film LO is formed by thermal oxidation in the region from which the ONO film is removed, and an n-type impurity is injected thereto to form a drain region MD and a source region MS. Subsequently, a polysilicon layer is deposited, and a memory gate electrode MG is formed by photolithography techniques and dry etching techniques. The memory gate electrode extends in the horizontal direction of the drawing and is in a linear pattern.

In the memory cell shown in FIG. 8, the ONO film over the source region MS and drain region MD is removed, and the silicon nitride film, which is used as a charge trapping portion, is left merely partially in the memory region. On the other hand, like the memory cell shown in FIG. 9, a structure in which the entire surface of the memory region is covered with a silicon nitride film, which is used as a charge trapping portion, may be used. In this case, except for contact parts, the entire region of the memory region of the memory array is covered with the silicon nitride film. Since the silicon nitride film is a film that does not readily allow permeation of hydrogen, when the entire surface is covered with the silicon nitride film, after formation of the silicon nitride film, hydrogen can be prevented from entering the region of the silicon nitride film serving as a charge trapping portion during manufacturing processes, and therefore, increase of the hydrogen concentration in the silicon nitride film to more than $5\times10^{20}$ cm$^{-3}$ can be suppressed.

Figure 9:
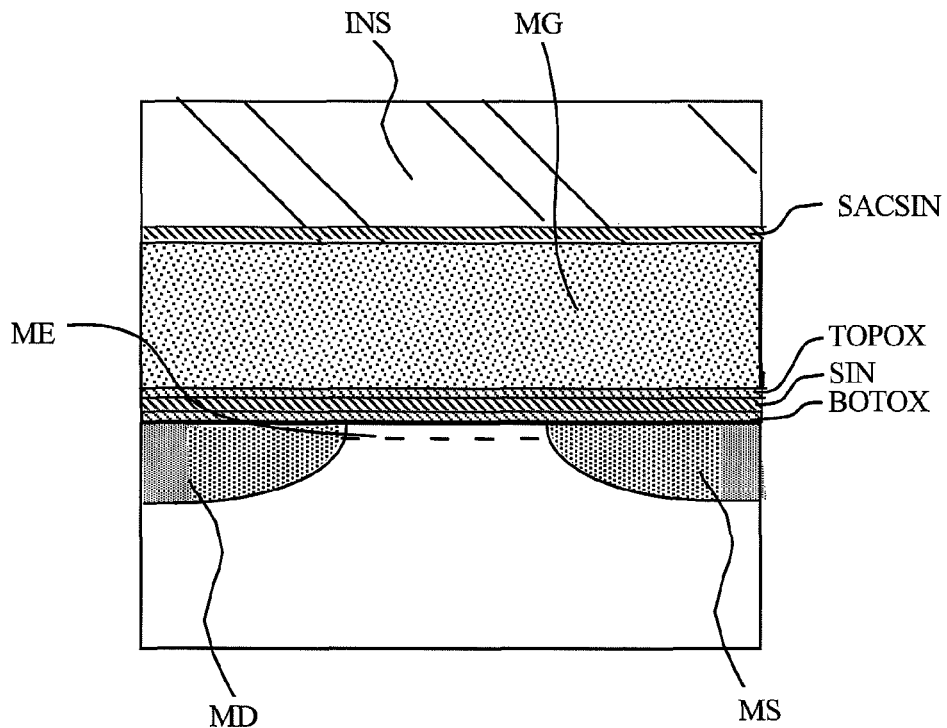
FIG. 9 is a cross-sectional view of a principal part of another nonvolatile semiconductor memory device (flash memory) according to the embodiment of the present invention.

In FIG. 9, merely one memory cell is disclosed. However, in the present embodiment, the silicon nitride film in FIG. 9 is formed to be shared with a silicon nitrogen film serving as a charge trapping film for other memory cell; an end portion of a side surface of the silicon nitride film is not in the memory cell like FIG. 8, but formed to be disposed at least outside the memory region; and the silicon nitride film is formed to cover the bottom oxide film. In other words, in the memory region, except for the contact parts, the silicon nitride film is formed on the entire surface and covers the entire surface of the bottom oxide film.

The reason for manufacturing such a structure is described below. The hydrogen that is generated during manufacturing processes after formation of the silicon nitride film enters the region of the silicon nitride film serving as a charge trapping portion via the bottom oxide film. From this point of view, the difference between this structure and the structure of FIG. 8 is that a main access path of the hydrogen to the bottom oxide film can be a path via a region outside the memory region. Accordingly, covering the entire surface of the bottom oxide film with the silicon nitride film can suppress the phenomenon that hydrogen enters the region of the silicon nitride film serving as the charge trapping portion via the bottom oxide film and the hydrogen concentration in the silicon nitride film is increased to more than $5 \times 10^{20}$ cm$^{-3}$.

As a matter of course, the bottom oxide film and the silicon nitride film are not formed on the contact parts in the memory region. The bottom oxide film is formed on the entire surface in FIG. 9. However, forming the bottom oxide film on the entire surface is not required for obtaining the effect. The bottom oxide film may be partially removed after formation of the bottom oxide film, and the silicon nitride film may be then formed on the entire surface.

The embodiments relating to a single gate type memory cell shown in FIG. 1 have been shown. However, the present invention can obtain similar effects in split gate type memory cells shown in cross-sectional views of principal parts of FIG. 10 to FIG. 13 by using a nitride film having a hydrogen concentration of $5 \times 10^{20}$ cm$^{-3}$ or less as a nitride film serving as a charge trapping portion.

Figure 10:
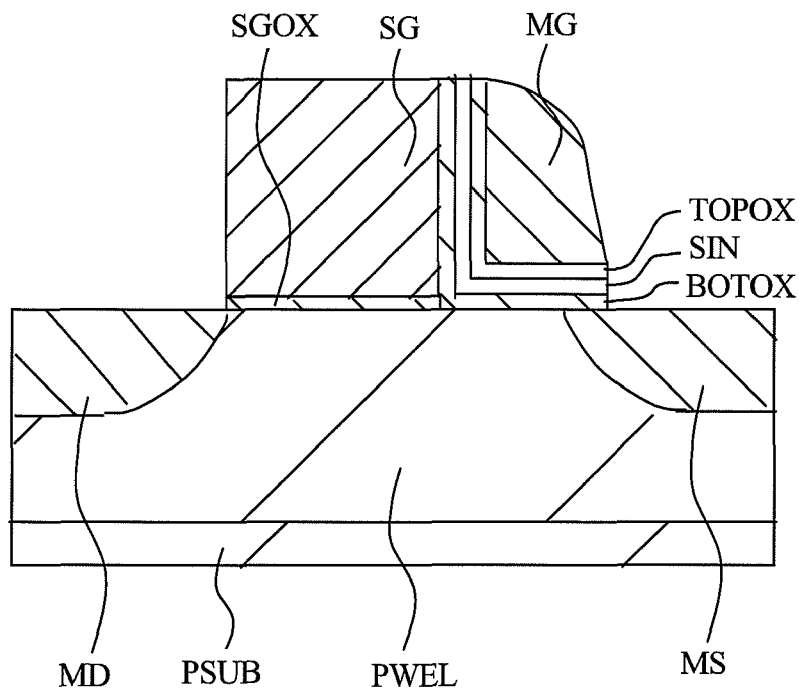
FIG. 10 is a cross-sectional view of a principal part of another nonvolatile semiconductor memory device (flash memory) according to the embodiment of the present invention.

The memory cell shown in FIG. 10 includes: an ONO film composed of a stacked film of a silicon nitride film SIN for trapping charges and oxide films BOTOX and TOPOX positioned over and under the silicon nitride film; a memory gate electrode MG composed of an electric conductor such as n-type polysilicon; a select gate electrode SG composed of n-type polysilicon; a gate dielectric film SGOX positioned under the select gate electrode SG; a source region MS composed of an n-type impurity; and a drain region MD composed of an n-type impurity. Note that the source region MS and the drain region MD are formed in a p-type well region PWEL provided over a p-type silicon substrate PSUB. The memory gate electrode MG is formed in the shape of a side wall spacer of the select gate electrode SG. First, the select gate SG is formed, thereafter, the ONO film (BOTOX, SIN, and TOPOX) is formed, and the memory gate electrode MG is formed by utilizing anisotropy etching techniques.

Figure 11:
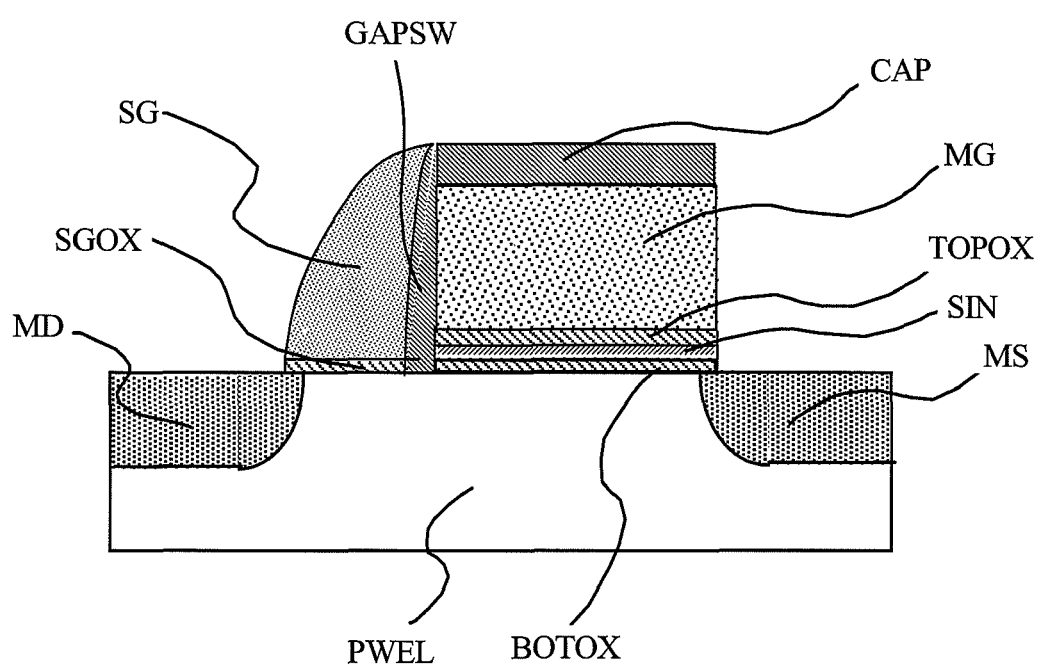
FIG. 11 is a cross-sectional view of a principal part of another nonvolatile semiconductor memory device (flash memory) according to the embodiment of the present invention.

FIG. 11 shows a memory cell in which a select gate electrode SG is formed in the shape of a side wall spacer of a memory gate electrode MG. In the case of such a memory cell, first, an ONO film (BOTOX, SIN, and TOPOX) and the memory gate electrode MG are formed, and thereafter a side wall spacer GAPSW composed of a dielectric film is formed on the side wall of the memory gate electrode. Furthermore, on the side wall of the spacer, the select gate electrode SG is formed by utilizing anisotropy etching techniques. In order to ensure withstand voltage for the memory gate electrode MG and the select gate electrode SG, a cap oxide film layer CAP is formed over the memory gate electrode MG.

Figure 12:
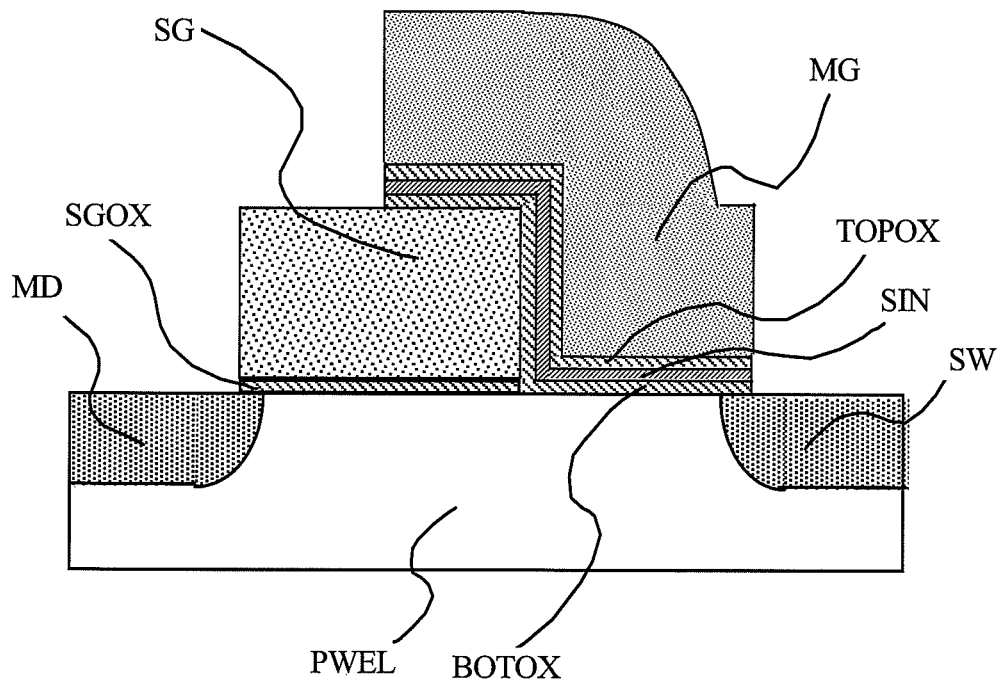
FIG. 12 is a cross-sectional view of a principal part of another nonvolatile semiconductor memory device (flash memory) according to the embodiment of the present invention.

FIG. 12 shows a memory cell having a structure in which a memory gate electrode MG partially covers a select gate electrode SG. In the case of such a memory cell, first, the select gate electrode SG is formed, and then an ONO film and the memory gate electrode MG are formed by utilizing photolithography techniques.

Figure 13:
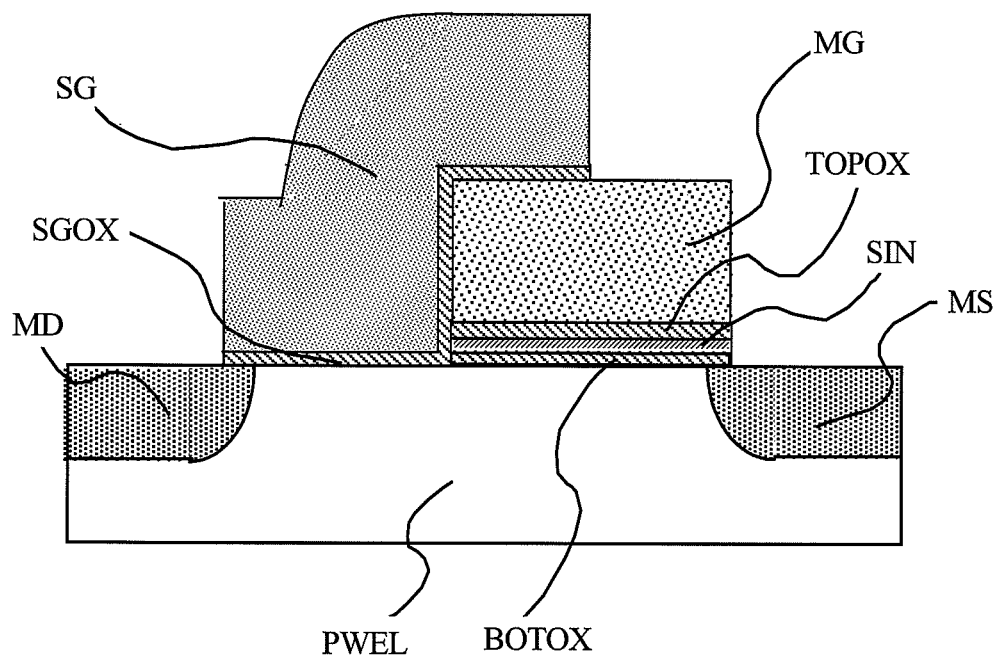
FIG. 13 is a cross-sectional view of a principal part of another nonvolatile semiconductor memory device (flash memory) according to the embodiment of the present invention.

FIG. 13 shows a memory cell having a structure in which a select gate electrode SG partially covers a memory gate electrode MG. In the case of such a memory cell, except that the select gate electrode SG is formed by photolithography techniques, it can be formed as well as the memory cell shown in FIG. 11. In other words, after an ONO film and the memory gate electrode MG are formed, the select gate electrode SG is formed.

The memory cells shown in FIG. 10 to FIG. 13 can be operated by the same program method, erase method, and read method. The point different from the operating methods of the memory cell shown in FIG. 1 is basically merely the program operation. The program operation is performed by hot electron injection which is a so-called source side injection method. As program voltages, for example, a voltage Vs applied to the source region MS is 5 V, a voltage Vmg applied to the memory gate electrode MG is 10 V, a voltage Vsg applied to the select gate electrode SG is 1.5 V, a voltage Vd applied to the drain region MD is approximately 0.7 V so that a current flowing into the channel is made to be 1 μA, and a voltage Vwell applied to the well is 0 V. The erase operation is performed by hot hole injection utilizing BTBT or FN tunneling as well as the memory cell shown in FIG. 1. The read operation is also performed by using the voltages between the source and drain applied in a reverse direction to the direction at the time of program as well as the memory cell shown in FIG. 1.

In the split gate type structures shown in FIG. 10 to FIG. 13, the areas of the memory cells are increased; however, the structures have advantages that, for example, the program current can be reduced as compared with the memory cell of FIG. 1; a word driver can be configured with a low-voltage MOS transistor by reducing the thickness of the gate dielectric film of the select gate; and a high-speed read operation can be performed.

Next, a manufacturing method of the silicon nitride film SIN of the charge trapping portion with a hydrogen concentration of $5 \times 10^{20}$ cm$^{-3}$ or less will be described. The silicon nitride film having a low hydrogen concentration can be formed by any of below manufacturing methods (a) to (c).

(a) After a silicon nitride film is formed by the LPCVD method, plasma nitridation using a nitrogen gas is performed. The N—H bonds and Si—H bonds in the silicon nitride film are broken by the energy of the plasma, and hydrogen is detached. As a result, dangling bonds appear. Then, nitrogen atoms bond to the dangling bonds, thereby reducing the hydrogen concentration. A specific manufacturing method is, for example, as described below.

First of all, after the temperature of a reactor furnace of LPCVD equipment is made to be approximately 750° C., gases of dichlorosilane ($SiH_2Cl_2$) and ammonia ($NH_3$) are introduced into the furnace at flow rates of 50 sccm and 500 sccm, respectively, so that a silicon nitride film is deposited on the bottom oxide film of the ONO film. A film thickness of the silicon nitride film is 1 nm to 8 nm, more preferably, 1 nm to 3 nm. Then, in plasma nitridation equipment, a nitrogen gas and an argon gas are ionized by an alternating electric and magnetic field of 13.56 MHz to generate a nitrogen plasma gas, the silicon nitride film is subjected to plasma nitridation by exposing the nitrogen plasma gas thereto with the LPCD method. In this process, the substrate temperature is made to be 450° C. When the film thickness of the silicon nitride film to be subjected to plasma nitridation is thick, the hydrogen concentration cannot be readily reduced; therefore, when a thick silicon nitride film is to be formed, preferably deposition of a silicon nitride film by the LPCVD method and plasma nitridation using the nitrogen gas are alternately performed. In this process, a parallel plate type plasma CVD is employed; however, radical nitraidation using Inductively Coupled Plasma or microwaves can be also performed.

(b) A silicon nitride film is deposited by a sputtering method using a target material and gas having a small hydrogen content. Since the hydrogen content of the target material and gas is small, the silicon nitride film having a low hydrogen concentration can be formed. For example, the substrate temperature is made to be 400° C., and the silicon nitride film is formed by sputtering a target of silicon with an argon and nitrogen gas.

(c) A silicon nitride film is formed by an ALD method in which the film is alternately exposed to a gas containing silicon but not containing hydrogen and a nitrogen plasma gas. Since hydrogen is not contained in the raw material gases, the silicon nitride film having a low hydrogen concentration is obtained. In the plasma CVD method not using the ALD method, when a thin silicon nitride film is to be formed, the power of plasma generation has to be suppressed, and a silicon nitride film in which silicon is excessive as compared with the composition ratio of $Si_3N_4$ is formed. The silicon nitride film in which silicon is excessive is inferior in the charge retaining ability since many shallow level traps are present in the film. On the other hand, with ALD method, sufficient nitrogen can be introduced into the silicon nitride film, and therefore the composition ratio of silicon can be reduced until X becomes 0.05 or less in the composition ratio $Si_{3+X}N_4$ of silicon and nitrogen.

As described above, when the silicon nitride film in which the composition ratio is reduced until X of $Si_{3+X}N_4$ becomes 0.05 or less is used, the silicon nitride film having a high charge retaining ability can be obtained. A charge trapping film having a high charge retaining ability can be formed. As a specific manufacturing method, after the temperature in a reactor furnace of ALD equipment is made to be 550° C., a gas containing silicon and a nitrogen plasma gas are alternately introduced. As the gas containing silicon not containing hydrogen, silicon tetrachloride $SiCl_4$ is or hexachlorodisilane $Si_2Cl_6$ can be used; and as the nitrogen plasma gas, a plasma gas of $N_2$ or $N_2$ and a rare gas such as Ar can be used. The plasma gas is generated outside the reactor furnace and introduced thereinto.

Hereinabove, the formation method of the silicon nitride film for charge trapping in which the hydrogen concentration is reduced in the entire film of the silicon nitride film has been described; however, deterioration of the data retention characteristics can be suppressed when the hydrogen concentration in the silicon nitride film can be reduced in the vicinity of the interface between the silicon nitride film and the bottom oxide film or the top oxide film. This is because the hydrogen in the silicon nitride film is not readily diffused, and therefore, among hydrogen that its bonding is broken by the hot carrier injection, hydrogen present at a deep position from the interface of the silicon nitride film cannot escape therefrom. Specifically, when the retention temperature is 150° C., hydrogen existing in a region that is 3 nm or less from the interface between the silicon nitride film and the bottom oxide film or between the silicon nitride film and the top oxide film deteriorates the data retention characteristics.

Figure 14:
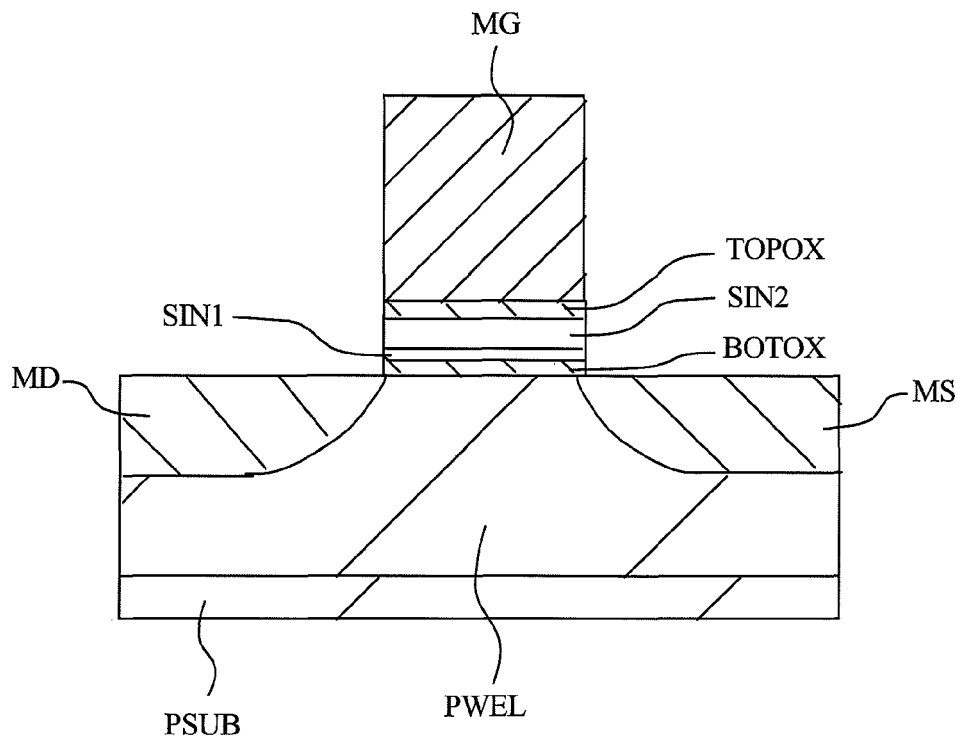
FIG. 14 is a cross-sectional view of a principal part of another nonvolatile semiconductor memory device (flash memory) according to the embodiment of the present invention.
Figure 15:
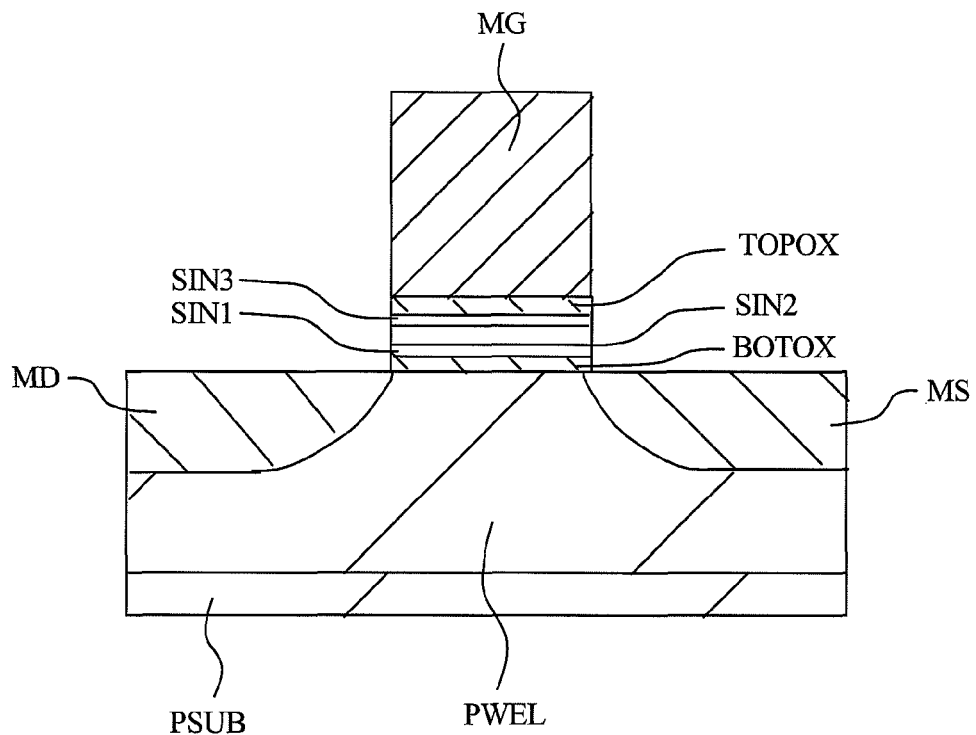
FIG. 15 is a cross-sectional view of a principal part of another nonvolatile semiconductor memory device (flash memory) according to the embodiment of the present invention.

Therefore, as shown in FIG. 14, when merely a silicon nitride film SIN1 having a film thickness of 3 nm or less at the side of the interface with the bottom oxide film is made to be a silicon nitride film having a low hydrogen concentration of $5\times10^{20}$ cm$^{-3}$ or less, and also as a silicon nitride film SIN2 existing over the film SIN1, a silicon nitride film is formed by a normally used method such as the LPCVD method, the hydrogen release amount can be reduced. Also, as shown in FIG. 15, when a silicon nitride film SIN3 having a film thickness of 3 nm or less at the side of the interface with the top oxide film is made to be a silicon nitride film having a hydrogen concentration of $5\times10^{20}$ cm$^{-3}$ or less, in addition to the silicon nitride film SIN1 having the film thickness of 3 nm or less at the side of the interface with the bottom oxide film, the hydrogen release amount can be further suppressed.

The thin silicon nitride film SIN1 or SIN 3 having a low hydrogen concentration can be formed by the above described manufacturing methods (a) to (c). The silicon nitride film SIN1 at the interface side with the bottom oxide film can be formed by a method (d) described below.

(d) The bottom oxide film BOTOX is subjected to plasma nitridation by a nitrogen plasma gas, so that the oxygen in the bottom oxide film BOTOX is replaced by nitrogen to form a silicon nitride film. The oxygen in the bottom oxide film BOTOX is left, so that the silicon nitride film containing oxygen is obtained. The hydrogen concentration of the bottom oxide film BOTOX is low, and the gas used in nitridation also does not contain hydrogen; therefore, the silicon nitride film having a low hydrogen concentration can be obtained.

The silicon nitride film SIN1 or SIN3 having a low hydrogen concentration may be formed by combining the above described manufacturing methods (a) to (d). A silicon nitride film, for charge trapping, into which the thin film SIN1 or SIN3 of the silicon nitride film having a low hydrogen concentration is inserted can be also used in the split gate type memory cells of FIG. 10 to FIG. 13.

Improvement of the data retention characteristics by the hydrogen concentration of $5\times10^{20}$ cm$^{-3}$ or less in the nitride film serving as the charge trapping portion has been described above; however, the data retention characteristics can be further improved desirably by using a nitride film having a hydrogen concentration of $3\times10^{20}$ cm$^{-3}$ or less, more desirably, a hydrogen concentration of $1\times10^{20}$ cm$^{-3}$ or less.

Second Embodiment

In the present embodiment, among the three mechanisms causing deterioration of the data retention characteristics, "diffusion of hydrogen" is controlled, thereby reducing the concentration of released hydrogen and suppressing deterioration of the data retention characteristics. Specifically, the silicon nitride film for SAC on the memory cell is eliminated, thereby ensuring a path through which hydrogen is diffused above the memory cell to reduce the hydrogen concentration in a vicinity of the memory cell. However, SAC techniques are necessary techniques in recent semiconductor devices using MOS transistors, and the silicon nitride film for SAC cannot be eliminated in the entire region of the nonvolatile semiconductor memory device. Therefore, the silicon nitride film for SAC is eliminated merely in the region of a memory array.

Incidentally, since deterioration of the data retention characteristics can be suppressed by eliminating the silicon nitride film for SAC in this manner, the hydrogen concentration of the nitride film that serves as a charge retention part is not required to be $5\times10^{20}$ cm$^{-3}$ or less. However, from the viewpoint of the data retention characteristics, the hydrogen concentration of the nitride film that serves as the charge retention part is desired to be $5\times10^{20}$ cm$^{-3}$ or less.

Figure 16:
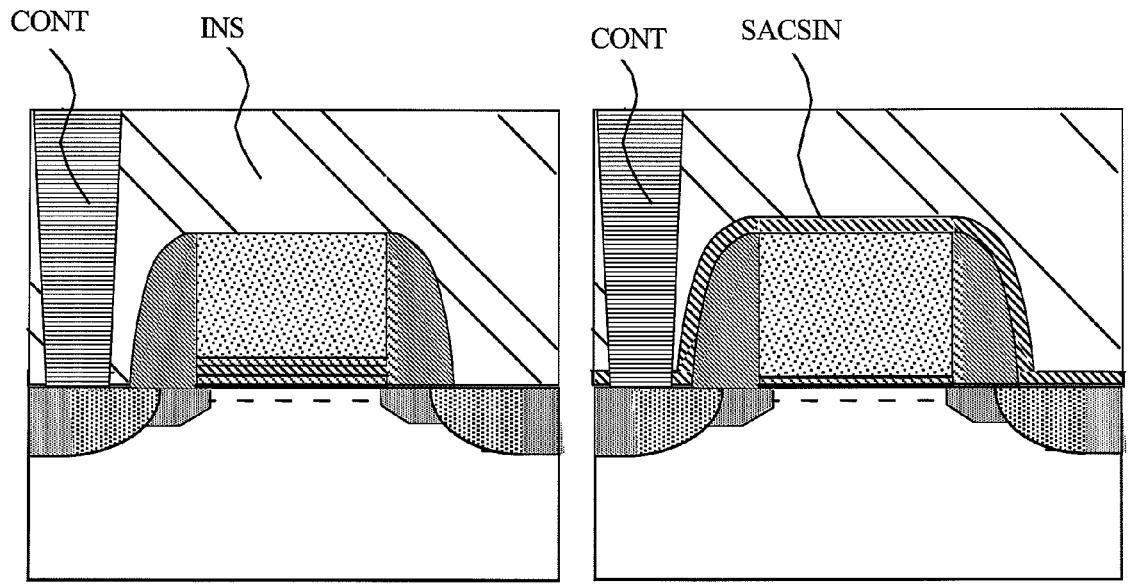
FIG. 16 is a cross-sectional view of a principal part of another nonvolatile semiconductor memory device (flash memory) according to the embodiment of the present invention.

FIG. 16 shows cross-sectional views of principal parts of a nonvolatile semiconductor memory device of the present embodiment, and the right and left cross-sectional views respectively show a MONOS type memory cell and a MOS transistor formed in the same semiconductor device.

The left-side MONOS type memory cell representatively shows one memory cell present in a memory region, and is configured with one MOS transistor. The difference from the memory cell shown in FIG. 7 is that the silicon nitride film SACSIN for SAC is eliminated.

The right-side transistor representatively shows an n-type or p-type MOS transistor present in the nonvolatile semiconductor memory device, and the case of n-type is shown herein as an example. MOS transistors are used in peripheral circuits for operating the nonvolatile semiconductor memory, I/O circuits for inputting/outputting data to or from outside, and logic circuits realizing a microcomputer function in a flash-consolidated microcomputer. In this place, a transistor in a logic region in which a logic circuit is formed is shown. As shown in the right side of FIG. 16, a silicon nitride film SACSIN for SAC is formed on the MOS transistor.

In other words, FIG. 16 discloses the transistor constituting the memory cell formed in the memory region, the transistor formed in the logic region, a contact connected to the source or drain of the transistor formed in the memory region, and a second contact connected to the source or drain of the transistor of the logic region. The gate electrode, the source, and the drain of the transistor of the memory region are not covered with a silicon nitride film for forming a self-align contact. Meanwhile, the gate electrode, the source and the drain to which the contact of the transistor of the logic region is connected are covered with a silicon nitride film for forming a self-align contact. Incidentally, the silicon nitride film for a self-align contact in the logic region is not necessarily required to cover the entire surface, but may be required to be formed at least on the source or drain to which the contact is connected.

The structure shown in FIG. 16 can be formed by depositing a silicon nitride film for SAC on the entire wafer surface and then selectively removing the silicon nitride film in the memory region by photolithography techniques and etching techniques. When this structure is employed, in a region other than the region of the memory array, circuits in which MOS transistors are disposed with a high density can be manufactured by using SAC techniques; and in the region of the memory array, although there is a drawback that adjustment allowance of contacts has to be secured, deterioration of the data retention characteristics caused by the hydrogen released from the silicon nitride film of the charge trapping portion can be suppressed.

Figure 17:
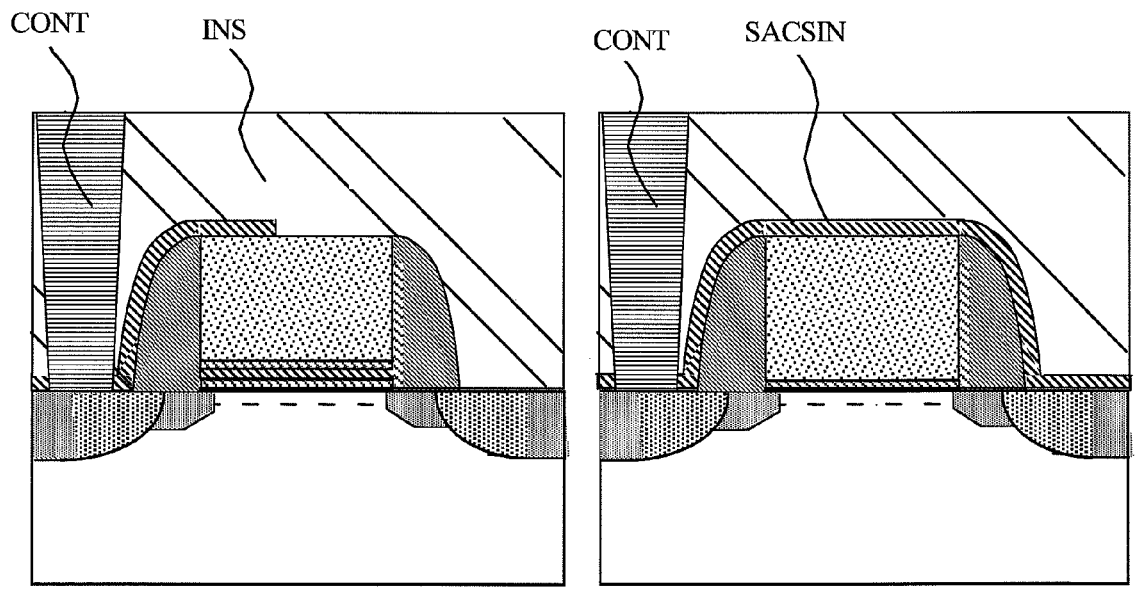
FIG. 17 is a cross-sectional view of a principal part of another nonvolatile semiconductor memory device (flash memory) according to the embodiment of the present invention.

FIG. 17 shows another mode of the present embodiment. In the embodiment shown in FIG. 16, all the silicon nitride film for SAC on the memory array is removed; on the other hand, in the embodiment of FIG. 17, the silicon nitride film for SAC in a vicinity of the contact part of the memory region is left, and the silicon nitride film for SAC on the memory region other than that region is removed. This structure can be manufactured by depositing the silicon nitride film for SAC on the entire wafer surface; exposing the region of the silicon nitride film that is desired to be removed by photolithography techniques; and etching the silicon nitride film.

In other words, in FIG. 17, in the transistor of the memory region, instead of covering the entire transistor which constitutes the memory cell with the silicon nitride film for SAC, the silicon nitride film for forming a self-align contact is formed at least on the source or drain to which the contact is connected. Note that, as well as FIG. 16, the silicon nitride film for a self-align contact in the logic region is not always required to cover the entire surface, but is required to be formed at least on the source or drain to which the contact is connected.

In the example shown in FIG. 17, the difference from the example of FIG. 16 is that there is not such a drawback that the adjustment allowance for contact has to be secured. Moreover, since the path through which hydrogen is diffused above the memory cell is ensured, deterioration of the data retention characteristics can be suppressed although the effect is small as compared with the example of FIG. 16. In FIG. 16 and FIG. 17, the example using the single gate type memory cell of FIG. 1 has been shown; however, also in the case of using the split gate type memory cells shown in FIG. 10 to FIG. 14, similar effects can be obtained.

Third Embodiment

In the present embodiment, among the three mechanisms causing deterioration of the data retention characteristics, "deterioration reaction caused by hydrogen" is suppressed, thereby suppressing deterioration of the data retention characteristics. Specifically, an element such as a halogen element having a larger bonding energy to silicon than hydrogen is introduced into the interface between the silicon substrate and the bottom oxide film and into the bottom oxide film of the memory cell, so that the generation reactions of the interface state and positive fixed charge caused by hydrogen do not readily occur.

Figure 18:
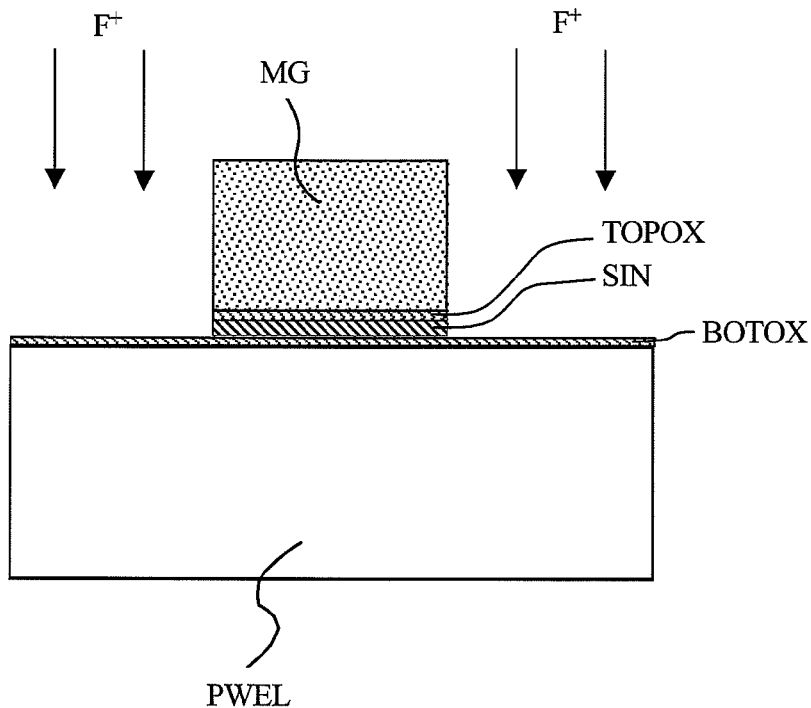
FIG. 18 is a cross-sectional view of a principal part of a substrate showing a manufacturing method of the nonvolatile semiconductor memory device according to the embodiment of the present invention.
Figure 19:
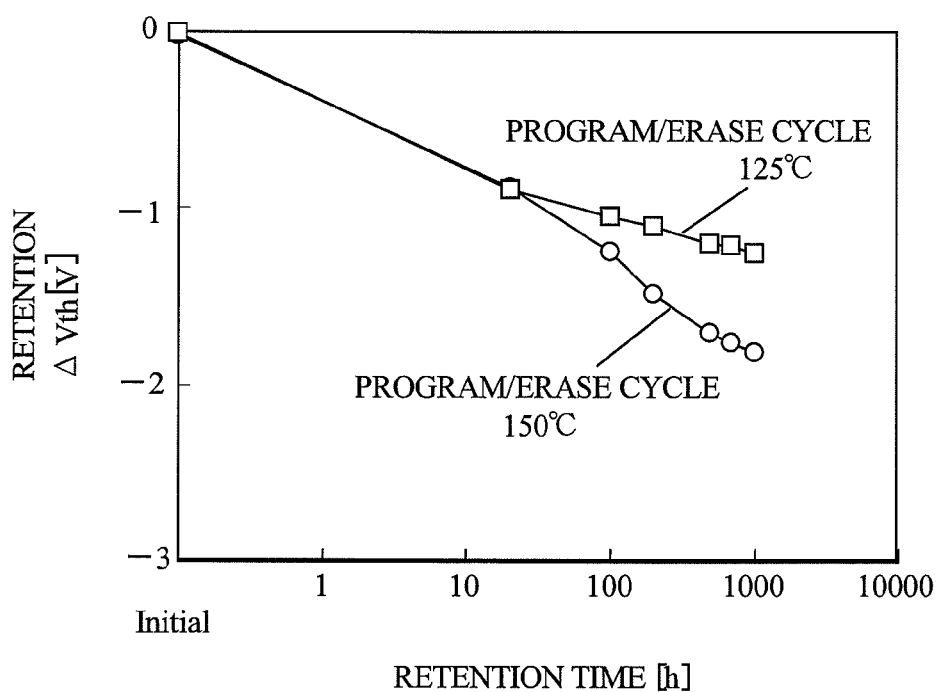
FIG. 19 is a graph showing retention temperature dependency of data retention characteristics of program-side.
Figure 20:
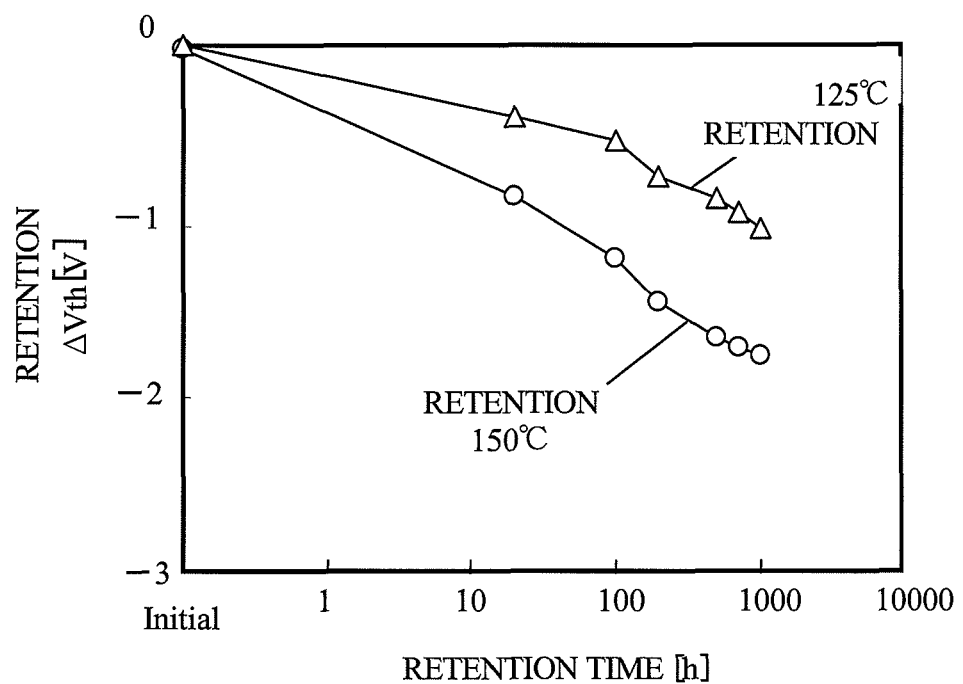
FIG. 20 is a graph showing program/erase cycle temperature dependency of data retention characteristics of program-side.
Figure 21:
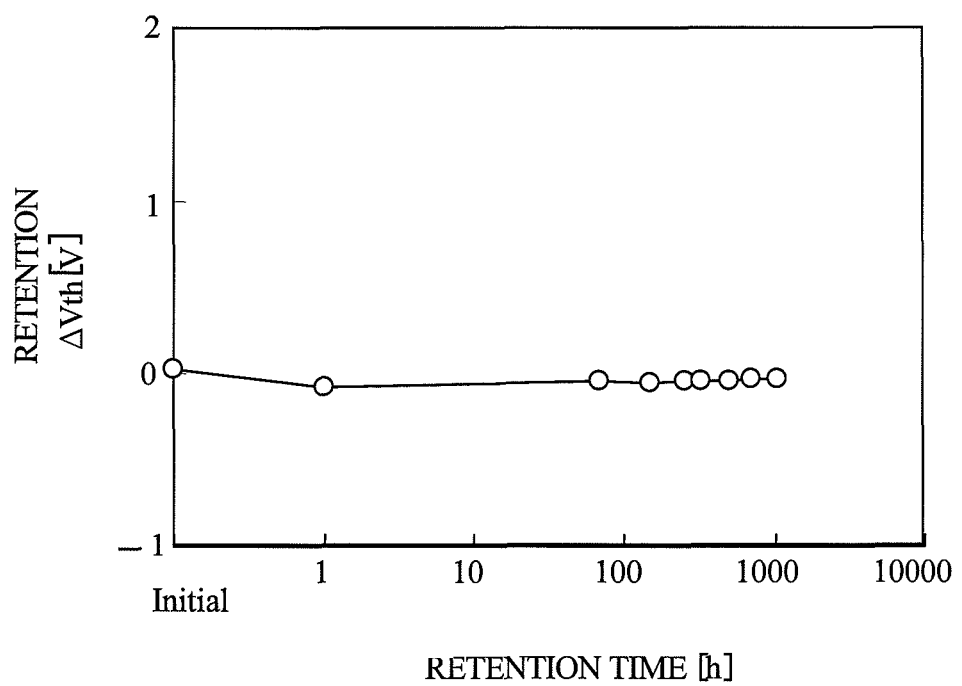
FIG. 21 is a graph showing data retention characteristics of erase-side.
Figure 22:
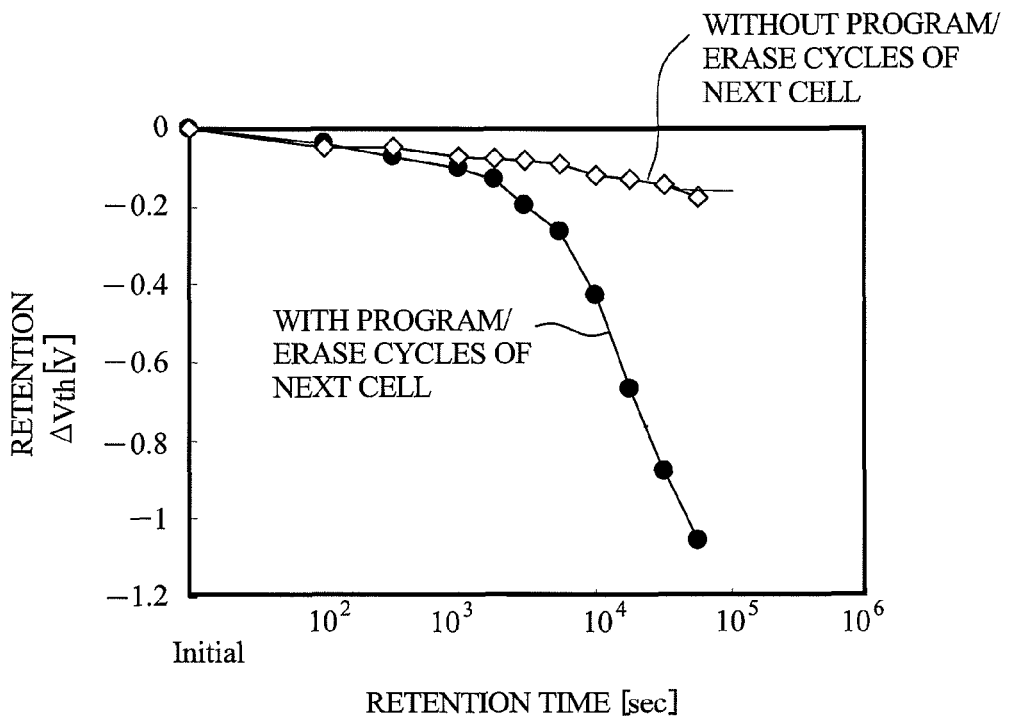
FIG. 22 is a graph comparing data retention characteristics of the case in which a next cell undergoes program/erase cycles to the case in which it does not undergo the program/erase cycles.

FIG. 18 is a cross-sectional view of a principal part of a nonvolatile semiconductor memory device showing manufacturing processes for realizing the present embodiment, and an example in which an element to be introduced is fluorine which is a halogen element is explained.

A memory gate electrode MG is formed by using photolithography techniques and dry etching techniques, after the top oxide film TOPOX and the silicon nitride film SIN are respectively removed with hydrofluoric acid and hot phosphoric acid, ion implantation of fluorine is performed. For example, the ion implantation amount of fluorine is $2\times10^{15}$ $cm^{-2}$, and the implantation energy is 15 keV. Thereafter, in a process of thermal treatment, fluorine is taken into the interface of the silicon substrate and the bottom oxide film or into the bottom oxide film, and Si—F bonds are formed. Instead of fluorine, other element such as chlorine or deuterium having a larger bonding energy to silicon than hydrogen may be injected. As a result, Si—F bonds are formed in the bottom oxide film.

Incidentally, as a matter of course, when a halogen element is used, bonds between halogen elements and silicon elements are formed. Particularly, among halogen elements, since the mass of fluorine or chlorine is small, when the fluorine or chlorine element is used, there is a merit that damage to the silicon oxide film or to silicon substrate in ion implantation is small as compared with the case of using other halogen elements.

In FIG. 18, the case of using the single gate type memory cell of FIG. 1 shown in the first embodiment has been shown as an example; however, similar effects can be also obtained in the cases of using the split gate type memory cells shown in FIG. 10 to FIG. 14.

Hereinabove, the first to third embodiment have been described; and when a plurality of them are performed in combination instead of performing one of these embodiments independently, further effects of improving data retention characteristic can be obtained.

Hereinabove, the invention which has been made by the present inventors has been concretely described based on the embodiments. However, it is needless to say that the present invention is not limited to the above described embodiments, and it can be modified variously without departing from the gist thereof.

The present invention can be applied to nonvolatile semiconductor memory devices.

What is claimed is:

1. A nonvolatile semiconductor memory device comprising:
    a pair of source and drain regions formed in a semiconductor substrate;

a first gate electrode formed over a region of the semiconductor substrate between the source and drain regions; and a charge trapping portion formed between a surface of the semiconductor substrate and the first gate electrode, wherein the charge trapping portion includes a first nitride film and a second nitride film, wherein, in the first nitride film, a total concentration of N—H bonds and Si—H bonds is $5 \times 10^{20}$ cm$^{-3}$ or less, wherein the second nitride film is formed directly on the first nitride film, and wherein a program or erase is performed by hot carrier injection into the charge trapping portion.

2. The nonvolatile semiconductor memory device according to claim 1, wherein a film thickness of the first nitride film is 3 nm or less.

3. The nonvolatile semiconductor memory device according to claim 1, wherein the charge trapping portion further includes a third nitride film, the third nitride film is formed directly on the second nitride film, and the third nitride film is a nitride film in which a total concentration of the N—H bonds and Si—H bonds is $5 \times 10^{20}$ cm$^{-3}$ or less.

4. The nonvolatile semiconductor memory device according to claim 3, wherein the film thickness of the third nitride film is 3 nm or less.

5. The nonvolatile semiconductor memory device according to claim 1, further comprising a second gate electrode formed over the region of the semiconductor substrate between the source and drain regions.

6. The nonvolatile semiconductor memory device according to claim 1, wherein the first nitride film is formed by depositing a nitride film by a chemical vapor deposition method and then being nitrided by nitrogen in a plasma state.

7. The nonvolatile semiconductor memory device according to claim 1, wherein the first nitride film is deposited and formed by a sputtering method.

8. The nonvolatile semiconductor memory device according to claim 1, wherein the first nitride film is deposited and formed by an atomic layer deposition method in which $SiCl_4$ or $Si_2Cl_6$ and a nitrogen gas in a plasma state are alternately exposed to the film.

9. The nonvolatile semiconductor memory device according to claim 1, wherein an oxide film is further disposed between the first nitride film and the surface of the semiconductor substrate, and the first nitride film is formed with a part of the oxide film being subjected to plasma nitridation.

10. The nonvolatile semiconductor memory device according to claim 1, wherein the first nitride film is an oxynitride film.

11. The nonvolatile semiconductor memory device according to claim 1, wherein the nitride film is a silicon nitride film, and when a composition of the silicon nitride film is $Si_{3+x}N_4$, X is 0.05 or less.

12. The nonvolatile semiconductor memory device according to claim 1, further comprising an additional nitride film that covers an entirety of the surface of the semiconductor substrate in the memory region except for a contact part of the semiconductor substrate.

13. The nonvolatile semiconductor memory device according to claim 1, further comprising an oxide film formed between the surface of the semiconductor substrate and the charge trapping portion, wherein a bond between a halogen element and a silicon element is present in an interface between the oxide film and the semiconductor substrate or in the oxide film.

14. The nonvolatile semiconductor memory device according to claim 13, wherein the halogen element is fluorine.

* * * * *